United States Patent
Kim et al.

(10) Patent No.: US 8,964,901 B2
(45) Date of Patent: *Feb. 24, 2015

(54) ANALOG/DIGITAL CO-DESIGN METHODOLOGY TO ACHIEVE HIGH LINEARITY AND LOW POWER DISSIPATION IN A RADIO FREQUENCY (RF) RECEIVER

(71) Applicants: Helen Kim, Sudbury, MA (US); Merlin Green, Salem, MA (US); Andrew Bolstad, Arlington, MA (US); Daniel D. Santiago, Waltham, MA (US); Michael N. Ericson, Waltham, MA (US); Karen Gettings, Carlisle, MA (US); Benjamin A. Miller, Cambridge, MA (US)

(72) Inventors: Helen Kim, Sudbury, MA (US); Merlin Green, Salem, MA (US); Andrew Bolstad, Arlington, MA (US); Daniel D. Santiago, Waltham, MA (US); Michael N. Ericson, Waltham, MA (US); Karen Gettings, Carlisle, MA (US); Benjamin A. Miller, Cambridge, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/950,706

(22) Filed: Jul. 25, 2013

(65) Prior Publication Data
US 2014/0030995 A1 Jan. 30, 2014

Related U.S. Application Data

(63) Continuation-in-part of application No. 13/227,583, filed on Sep. 8, 2011, now Pat. No. 8,644,437, and a continuation-in-part of application No. 13/558,651, filed on Jul. 26, 2012.

(60) Provisional application No. 61/430,934, filed on Jan. 7, 2011.

(51) Int. Cl.
*H04L 25/06* (2006.01)
*H04B 1/10* (2006.01)
(Continued)

(52) U.S. Cl.
CPC .............. *H04B 1/10* (2013.01); *G06F 17/5063* (2013.01); *H03F 1/30* (2013.01); *H03F 1/3205* (2013.01); *H03M 1/002* (2013.01); *H03M 1/0614* (2013.01); *H03M 1/1042* (2013.01); *H03M 1/12* (2013.01)
USPC ........... 375/318; 375/316; 375/322; 375/340; 375/346; 375/350

(58) Field of Classification Search
CPC ........... H04B 2201/70706; H04B 1/10; H04B 1/0039; H04B 1/109; G06F 17/5063; H03F 1/30; H03F 1/3205; H03M 1/002; H03M 1/0614; H03M 1/1042; H03M 1/12; H04L 1/04; H04L 27/2601; H04L 27/2614; H04L 5/00
USPC ......... 375/259, 316, 318, 322, 340, 344, 346, 375/351
See application file for complete search history.

(56) References Cited

U.S. PATENT DOCUMENTS 5,594,612 A  1/1997 Henrion
5,768,168 A  6/1998 Im
(Continued)

OTHER PUBLICATIONS
Office Action dated Apr. 2, 2014 from U.S. Appl. No. 13/558,651, filed Jul. 26, 2012.
(Continued)

*Primary Examiner* — Hirdepal Singh
(74) *Attorney, Agent, or Firm* — Daly, Crowley Mofford & Durkee, LLP

(57) ABSTRACT

Receiver design techniques are provided that are capable of producing relatively efficient, linear radio frequency (RF) receivers. During a design process, components of an analog receiver chain and digital nonlinearity compensation techniques are considered together to achieve reduced power consumption in the receiver.

25 Claims, 21 Drawing Sheets

(51) Int. Cl.
| | |
|---|---|
| *G06F 17/50* | (2006.01) |
| *H03F 1/30* | (2006.01) |
| *H03F 1/32* | (2006.01) |
| *H03M 1/10* | (2006.01) |
| *H03M 1/00* | (2006.01) |
| *H03M 1/06* | (2006.01) |
| *H03M 1/12* | (2006.01) |

(56) References Cited

U.S. PATENT DOCUMENTS

| | | | |
|---|---|---|---|
| 5,852,630 | A | 12/1998 | Langberg et al. |
| 6,360,191 | B1 | 3/2002 | Koza et al. |
| 6,570,514 | B1 | 5/2003 | Velazquez |
| 7,129,874 | B2 | 10/2006 | Bjornsen |
| 7,215,717 | B2 | 5/2007 | Doi |
| 7,460,613 | B2 | 12/2008 | Sahlman |
| 7,577,211 | B2 | 8/2009 | Braithwaite |
| 7,808,315 | B2 | 10/2010 | Goodman et al. |
| 8,301,104 | B1 | 10/2012 | Gupta et al. |
| 8,410,960 | B2 | 4/2013 | Hekstra et al. |
| 2003/0016741 | A1 | 1/2003 | Sasson et al. |
| 2004/0148578 | A1 | 7/2004 | McConaghy et al. |
| 2004/0172609 | A1 | 9/2004 | Hassibi et al. |
| 2005/0219089 | A1 | 10/2005 | Batruni |
| 2006/0133470 | A1 | 6/2006 | Raz et al. |
| 2006/0251164 | A1* | 11/2006 | Visoz et al. ............... 375/233 |
| 2006/0273942 | A1 | 12/2006 | Koste et al. |
| 2007/0280336 | A1* | 12/2007 | Zhang et al. ............... 375/148 |
| 2008/0130787 | A1 | 6/2008 | Copeland |
| 2008/0134109 | A1 | 6/2008 | Hammouda et al. |
| 2008/0187035 | A1 | 8/2008 | Nakamura et al. |
| 2008/0258949 | A1 | 10/2008 | Galton et al. |
| 2008/0270062 | A1 | 10/2008 | Laraia et al. |
| 2009/0033526 | A1* | 2/2009 | Rofougaran ............... 341/61 |
| 2010/0031206 | A1 | 2/2010 | Wu et al. |
| 2010/0249623 | A1 | 9/2010 | Makdissi |
| 2010/0306722 | A1* | 12/2010 | LeHoty et al. ............... 716/5 |
| 2011/0004885 | A1 | 1/2011 | Kikuchi et al. |
| 2011/0103455 | A1 | 5/2011 | Forrester et al. |
| 2011/0122005 | A1 | 5/2011 | Hekstra et al. |
| 2011/0304392 | A1 | 12/2011 | Zanchi |
| 2011/0314074 | A1* | 12/2011 | Batruni ............... 708/311 |
| 2012/0027418 | A1 | 2/2012 | Secondini et al. |
| 2012/0120990 | A1 | 5/2012 | Koren et al. |
| 2012/0154038 | A1 | 6/2012 | Kim et al. |
| 2012/0176191 | A1* | 7/2012 | Kim et al. ............... 327/560 |
| 2012/0231729 | A1* | 9/2012 | Xu et al. ............... 455/13.4 |
| 2014/0044158 | A1* | 2/2014 | Raghu et al. ............... 375/224 |

OTHER PUBLICATIONS

Office Action dated Mar. 14, 2014 for U.S. Appl. No. 13/626,913.
Response to Office Action dated Nov. 6, 2013 as filed on Mar. 3, 2013.
Balankutty, et al.; "An Ultra-Low Voltage, Low-Noise, High Linearity 900-MHz Receiver With Digitally Calibrated In-Band Feed-Forward Interferer Cancellation in 65-nm CMOS;" IEEE Journal of Solid-State Circuits; vol. 46, No. 10; Oct. 2011; pp. 2268-2283.
Borremans, et al.; "A 40 nm CMOS 0.4-6 GHz Receiver Resilient to Out-of-Band Blockers;" IEEE Journal of Solid-State Circuits; vol. 46, No. 7; Jul. 2011; pp. 1659-1671.
Darabi; "A Blocker Filtering Technique for SAW-Less Wireless Receivers;" IEEE Journal of Solid-State Circuits; vol. 42, No. 12; Dec. 2007; pp. 2766-2773.
Deng, et al.; "A SiGe PA With Dual Dynamic Bias Control and Memoryless Digital Predistortion for WCDMA Handset Applications;" IEEE Journal of Solid-State Circuits; vol. 41, No. 5; May 2006; pp. 1210-1221.
Keehr, et al.; "Successive Regeneration and Adaptive Cancellation of Higher Order Intermodulation Products in RF Receivers;" IEEE Transactions on Microwave Theory and Techniques; vol. 59, No. 5; May 2001; pp. 1379-1396.
Kim; "Highly Linear Wireless Receiver;" Presentation at Idea Stream Symposium; Lincoln Laboratory, Massachusetts Institute of Technology; May 4, 2012; 12 pages.

Morgan, et al.; "A Generalized Memory Polynomial Model for Digital Predistortion of RF Powers Amplifiers;" IEEE Transactions on Signal Processing; vol. 54, No. 10; Oct. 2006; pp. 3852-3860.
Tropp, et al.; "Signal Recovery From Random Measurements via Orthogonal Matching Pursuit;" IEEE Transactions on Information Theory; vol. 53, No. 12; Dec. 2007; pp. 4655-4666.
Herman, et al.; "Efficient Multidimensional Polynomial Filtering for Nonlinear Digital Predistortion;" HPEC Workshop 2008 Presentaion; MIT Lincoln Laboratory; Sep. 23, 2008; 4 pages.
Herman, et al.; "Efficient Multidimensional Polynomial Filtering for Nonlinear Digital Predistortion;" Sep. 23, 2008; 2 pages.
Kekatos, et al.; "Sparse Volterra and Polynomial Regression Models: Recoverability and Estimation;" IEEE Transactions on Signal Processing; vol. 59; No. 12; Dec. 2011; pp. 5907-5920.
Kim, et al.; "An Active Filter Achieving 43.6dBm OIP3;" Radio Frequency Integrated Circuits Symposium (RFIC); IEEE; Jun. 5-7, 2011; pp. 1-4.
Nazar, et al.; "Sparse Interactions: Identifying High-Dimensional Multilinear Systems via Compressed Sensing;" Communication, Control, and Computing (Allerton), 2010 48th Annual Allerton Conference on Sep. 29, 2010-Oct. 1, 2010; pp. 1589-1596.
Song, et al.; "Nonlinear Equalization Processor IC for Wideband Receivers and Sensors;" HPEC 2009 Presentation; Sep. 23, 2009; 26 pages.
Song, et al.; "Nonlinear Equalization Processor IC for Wideband Receivers and Sensors;" Sep. 23, 2009; 2 pages.
Walden, "Analog-to-Digital Converter Survey and Analysis;" IEEE Journal on Selected Areas in Communication; vol. 17.; No. 4; Apr. 1999; pp. 539-550.
Application of Bolstad, et al.; U.S. Appl. No. 13/626,913, filed Sep. 26, 2012.
International Search Report of the ISA for PCT/US2013/029069 dated May 9, 2013.
Written Opinion of the ISA for PCT/US2013/029096 dated May 9, 2013.
Baschirotto, et al.; "Advances on Analog Filters for Telecommunications;" IEEE; Design, Automation and Test in Europe, 2008; Mar. 10-14, 2008; pp. 131-168.
Behbahani, et al.; "A Broad-Band Tunable CMOS Channel-Select Filter for a Low-IF Wireless Receiver;" IEEE Journal of Solid-State Circuits; vol. 35; No. 4; Apr. 2000; pp. 476-489.
D'Amico, et al.; "A CMOS 5 nV/√Hz 74-dB-Gain-Range 82-dB-DR Multistandard Baseband Chain for Bluetooth, UMTS, and WLAN;" IEEE Journal of Solid-State Circuits; vol. 43; No. 7; Jul. 2008; pp. 1534-1541.
Iizuka, et al.; "A 14-bit Digitally Self-Calibrated Pipelined ADC With Adaptive Bias Optimization for Arbitrary Speeds Up to 40 MS/s;" IEEE Journal of Solid-State Circuits; vol. 41; No. 4; Apr. 2006; pp. 883-890.
Goodman, et al; "Polyphase Nonlinear Equalization of Time-Interleaved Analog-to-Digital Converters;" IEEE Journal of Selected Topics in Signal Processing; vol. 3; No. 3; Jun. 2009; pp. 362-373.
Quinn; "A Cascode Amplifier Nonlinerity Correction Technique;" Session XIV; Analog Techniques; IEEE International Solid-State Circuits Conference; Feb. 19, 1981; 3 pages.
Taherzadeh-Sani, et al.; "Power Optimization of Pipelined ADCs with High-Order Digital Gain Calibration;" Electronics, Circuits and Systems, 2007; ICECS; 14th IEEE International Conference on Dec. 11-14, 2007; pp. 661-664.
Yoshizawa, et al.; "Anti-Blocker Design Techniques for MOSFET-C Filters for Direct Conversion Receivers;" IEEE Journal of Solid-State Circuits; vol. 37; No. 3; Mar. 2002; pp. 357-364.
International Search Report and Written Opinion of the ISA for PCT/US2011/067222 dated Apr. 20, 2012.
U.S. Appl. No. 13/558,651, filed Jul. 26, 2012.
U.S. Appl. No. 13/227,583, filed Sep. 8, 2011.
Office Action dated Nov. 6, 2013 for U.S. Appl. No. 13/558,651.
Notice of Allowance for U.S. Appl. No. 13/626,913, filed Sep. 26, 2012; 7 pages.
Response to Office Action dated Mar. 14, 2014 as filed on Jun. 13, 2014 for U.S. Appl. No. 13/626,913.
Notice of Allowance dated Nov. 21, 2014 for U.S. Appl. No. 13/626,913, filed Sep. 26, 2012.

* cited by examiner

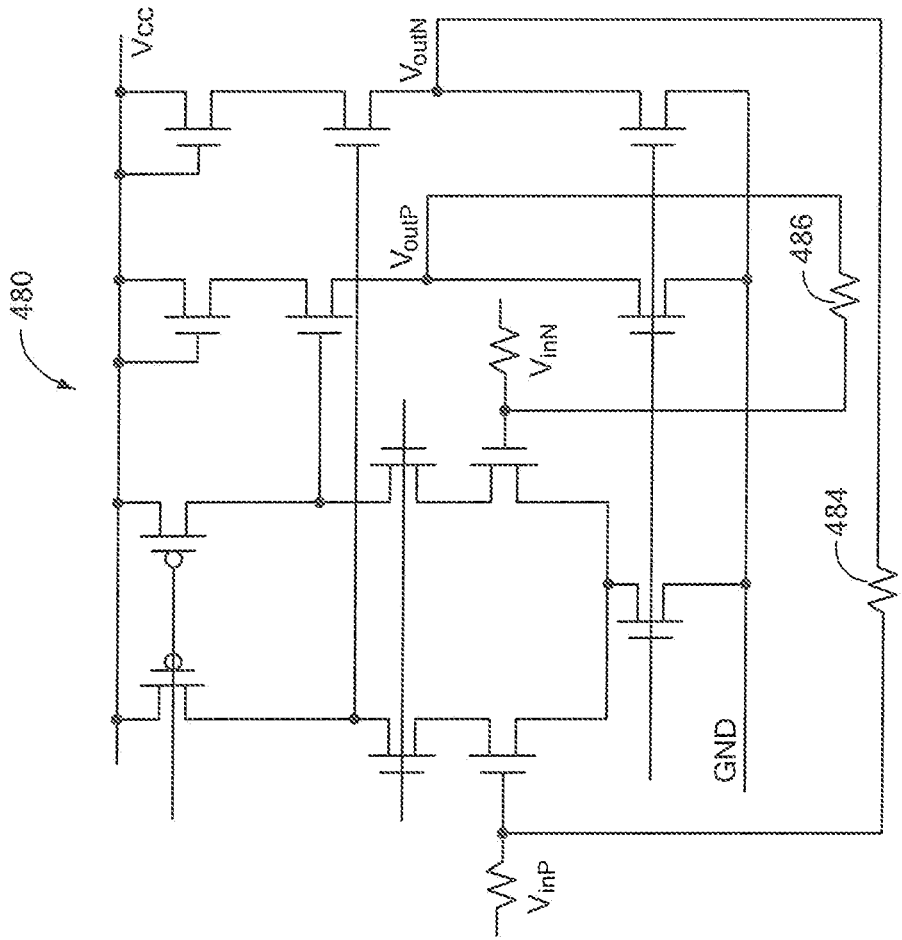
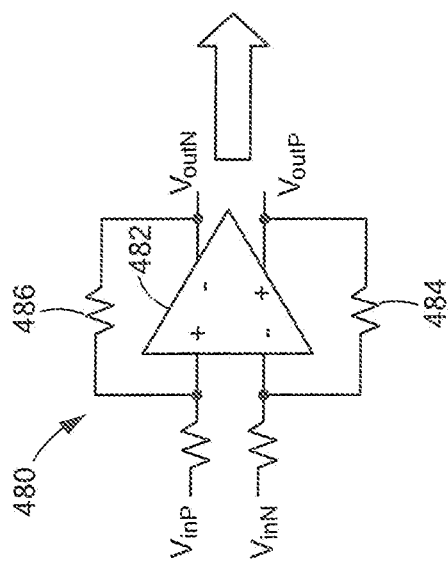
FIG. 15
FIG. 14

ANALOG/DIGITAL CO-DESIGN METHODOLOGY TO ACHIEVE HIGH LINEARITY AND LOW POWER DISSIPATION IN A RADIO FREQUENCY (RF) RECEIVER

CROSS REFERENCE TO RELATED APPLICATIONS

This application is a continuation in part of U.S. patent application Ser. No. 13/277,583, filed Sep. 8, 2011 now U.S. Pat. No. 8,644,437 which claims the benefit of U.S. Provisional Application Ser. No. 61/430,934 filed on Jan. 7, 2011 entitled "ACTIVE ANTI-ALIAS FILTER WITH NONLINEAR DIGITAL EQUALUZATION," which are each incorporated by reference herein in their entireties. This application is also a continuation in part of U.S. patent application Ser. No. 13/558,651, filed Jul. 26, 2012, which is hereby incorporated by reference in its entirety.

GOVERNMENT RIGHTS

This invention was made with government support under Contract No. FA8721-05-C-0002 awarded by the US Air Force. The government has certain rights in this invention.

FIELD

Subject matter disclosed herein relates generally to radio frequency (RF) systems and, more particularly, to techniques for designing RF receivers.

BACKGROUND

Nonlinear systems can be used to detect small signals in the presence of signals with significantly larger amplitudes. Such detection typically requires a high spur-free dynamic range (SFDR), which is a measure of the amplitude of the fundamental with respect to the amplitude of the largest harmonic tone or spur. These nonlinear systems can include several nonlinear functions that interact with one another to provide the desired output. One example is a radio frequency (RF) system with an RF receiver, an analog to digital converter (ADC) driver, an ant-alias filter and an ADC. The RF system receives a signal and converts it into the digital domain with the ADC. An anti-alias filter is required to remove high frequency tones that can alias into the baseband frequency range when subsequently sampled by the ADC.

ADC designers and manufacturers often focus on improving ADC linearity, without regard to the nonlinear distortion created by the other functions in the RF system signal chain, for example the RF receiver, ADC driver and anti-alias filter. Achieving a desired SFDR for a nonlinear system is best achieved when each function of the system is properly balanced with respect to SFDR because the system is only as strong as the weakest link. For example, with reference to FIG. 1A, a 16-bit ADC shown as element 18 with an SFDR of 90 dB requires the output of the anti-alias filter 16 to have an SFDR of at least 90 dB. Similarly, the output of the ADC driver 14 and the output of the RF receiver 12 each require an SFDR of at least 90 dB.

One way of achieving high SFDR for an RF system, shown in FIG. 1A, is to use an ADC driver 14 with very low distortion and an anti-alias filter using passive components such as inductors (L) and capacitors (C), also referred to as an LC filter. The low distortion ADC driver 14 dissipates a lot of power on the order of 1-2 Watts. The anti-alias LC filter is typically very large physically. Both the high power consumption and the large filter size make this approach undesirable.

An additional source of high power consumption arises from the need to impedance match the separate components in FIG. 1A with a fifty-ohm reference. Specifically, the RF receiver 12 and the ADC driver 14 are matched with a fifty ohm reference 20, the anti-alias filter 16 and the ADC driver 14 are matched with a fifty ohm reference 22 and the ADC 18 and the anti-alias filter 16 are matched with a fifty ohm reference 24. A fifty-ohm reference is typically needed or any interconnect that has an electrical length longer than approximately one tenth of the wavelength of the highest frequency tone in a Fourier transform of the propagated signal. This fact motivates integrating the various components onto a monolithic semiconductor chip.

A second way of achieving high SFDR for an RF system is to use a surface acoustic wave (SAW) filter 34, as shown in FIG. 1B, in place of the LC filter 16 shown in FIG. 1A. A SAW filter consumes less physical space than an LC filter; however, the SAW filter suffers from significant pass-band signal loss. For example, a SAW filter with a 40 MHz bandwidth and a 90 dB stop-band rejection may attenuate the pass-band signal by more than 20 dB. This attenuation requires the ADC driver 38 in FIG. 1B to have higher gain to compensate for the loss, which increases power consumption and complexity. ADC manufacturers have responded by integrating the ADC driver 38 with the ADC 40 in a single integrated circuit 36 (IC or "chip").

Several approaches attempt to reduce the power consumption from the fifty ohm references. In FIG. 1C, the RF receiver and the anti-alias filter 54 are integrated into a single IC 52. The ADC driver 58 and the ADC 60 are also integrated into a single IC 56. A single fifty-ohm reference 62 is required between the two ICs 52 and 56. An alternative arrangement shown in FIG. 1D integrates the anti-alias filter 74, ADC driver 76 and the RF receiver in a single IC 72. The IC 72 then drivers the ADC 78 through a fifty ohm reference 80.

A typical measure of nonlinearity used in RF systems is the third order intercept ($OIP_3$, $IP_3$ TOI). The $OIP_3$ is used to measure the effect of third order products in the bandwidth of interest, typically including the fundamental frequency (tone). FIG. 2 further illustrates the relevance of the third order products. For example, the fundamental f1 102 and f2 104 create second order intermodulation distortion products (IMD2) 106 and 108 from the sum and difference of the f1 102 and f2 104 frequencies. Similarly, third order distortion products (IMD3) 110 and 112 are created from the sum and difference of the second order harmonic which occurs at twice the frequency of f1 102 and f2 104. The difference signal ($2f2$-$f1$ or $2f1$-$f2$) is spectrally close to the fundamental frequencies f1 and f2 and is inside the bandwidth of interest because it is difficult to filter out. The difference signal ($2f2$-$f1$ or $2f1$-$f2$) is used in the computation of in-band $OIP_3$ to represent the nonlinearity of the system. A large $OIP_3$ represents a more linear system.

With reference to FIG. 1A, if the desired signal level at the input of the ADC 18 for a maximum signal-to-noise ratio (SNR) is 0 dBm, the nonlinearity of the anti-alias filter 16, ADC driver 14 and RF receiver 12 must be higher than 45 dBm. Table 1 compares typical results of anti-alias filters with a 3 dB bandwidth of at least 1 MHz, implemented in a silicon IC. Although the filters listed in Table 1 are not integrated with an RF receiver and an ADC, they can be integrated because they are implemented in a CMOS technology. The linearity of the three systems as measured by their respective OIP$_3$ (e.g. 18.5 dBm, 19.5 dBm and 24 dBm) each falls short of the required level of 45 dBm.

TABLE 1

Typical anti-alias filter performance

| Anti-alias filter | OIP$_3$ In-band | 3 dB cut-off frequency | Gain | Stop-band rejection | Input referred noise | Power | Technology |
|---|---|---|---|---|---|---|---|
| #1 | 19.5 dBm | 1.92 MHz | 8.5 dB | 63 dB | Integrated 46 uVrms | 11.6 mW | 0.8 µm BiCMOS |
| #2 | 24 dBm | 1, 2.2 or 11 MHz | -6-> 68 dB | Not Reported | 5 nV/√Hz | 55 mW | 0.13 µm CMOS |
| #3 | 18.5 dBm | 15 MHz | 0 dB | 60 dB | 15.2 nV/√Hz or 50 nV/√Hz for low power | 184.8 mW or 17.8 mW | 0.6 µm CMOS |

Radio frequency (RF) receivers are complex electronic systems that are typically required to meet strict performance specifications. One performance parameter that is sometimes difficult to achieve in an RF receiver is linearity. To achieve a specified linearity requirement, digital compensation circuitry may sometimes be added to an RF receiver design to suppress non-linear distortion components in an output signal of the RF receiver. Techniques are needed for designing RF receiver systems that use digital nonlinearity compensation.

SUMMARY

In accordance with one aspect of the concepts, systems, circuits, and techniques described herein, a method to design a receiver system comprises: generating an initial analog receiver design; characterizing nonlinearities in the initial analog receiver design; designing digital nonlinearity compensation circuitry for the Initial analog receiver design based on the nonlinearities and applying the digital nonlinearity compensation circuitry to the Initial analog receiver design; and modifying the analog receiver design and the digital nonlinearity compensation circuitry to identify a combination of the two that achieves a receiver linearity requirement with relatively low power consumption.

In accordance with another aspect of the concepts, systems, circuits and techniques described herein, a method for designing a receiver comprising an RF receiver chain followed by a digital equalization circuit comprises: selecting components for the RF receiver chain that allows the RF receiver chain to achieve receiver design requirements other than a receiver linearity requirement; and designing the digital equalization circuit to reduce non-linear distortion components in an output signal of the RF receiver chain in a manner that achieves the receiver linearity requirement; wherein selecting components for the RF receiver chain includes selecting components having nonlinear characteristics that require a relatively small number of computations within the digital equalization circuit to achieve the receiver linearity requirement.

In accordance with still another aspect of the concepts, systems, circuits, and techniques described herein, a method for designing a receiver comprising an RF receiver chain followed by a digital compensation circuit comprises: identifying multiple candidate RF receiver chain designs that are capable of achieving receiver design requirements other than a receiver linearity requirement; designing digital compensation circuits for each of the candidate analog receiver chain designs to achieve the receiver linearity requirement; and selecting an RF receiver chain/digital compensation circuit combination having a lowest power consumption.

In accordance with a further aspect of the concepts, systems, circuits, and techniques described herein, a method for designing a receiver system comprises: generating an RF receiver design based on specified system requirements; defining operational constraints for components of the analog receiver design to limit nonlinearity in the analog receiver design while achieving component performance requirements; characterizing non-linearities in the RF receiver design operating under the operational constraints; and designing supplemental digital compensation circuitry for the RF receiver design operating under the operational constraints to reduce non-linear distortion components in an output signal thereof; wherein generating an RF receiver design includes selecting components for the RF receiver design that are known to require a low level of supplemental digital compensation to achieve a receiver linearity requirement.

In accordance with a still further aspect of the concepts, systems, circuits, and techniques described herein, a method for designing a receiver system comprises: designing an RF receiver circuit based, at least in part, on specified receiver requirements; selecting circuit parameters for the RF receiver circuit based, at least in part, on the specified receiver requirements; identifying nonlinear distortion components in an output signal of the RF receiver circuit and sources of the non-linear distortion components within the analog receiver circuit; designing a digital compensation circuit for the RF receiver circuit to reduce nonlinear distortion components within the output signal of the RF receiver circuit and estimating power consumption of the digital compensation circuit; measuring linearity of the digitally compensated RF receiver circuit and, if a receiver linearity requirement has not been achieved, repeating identifying nonlinear distortion components, designing a digital compensation circuit, and measuring linearity until the receiver linearity requirement is achieved; and when the system linearity requirement has been achieved, determining whether a power condition has been satisfied and, if not, repeating designing an RF receiver circuit, selecting circuit parameters, identifying nonlinear distortion components, designing a digital compensation circuit, measuring linearity, and determining until the power condition has been satisfied.

In accordance with another aspect of the concepts, systems, circuits, and techniques described herein, a receiver system comprises: an RF receiver chain having a plurality of RF and analog circuit components, each of the RF and analog circuit components having known nonlinear response characteristics; and a digital equalizer coupled to an output of the RF receiver chain, the digital equalizer to reduce one or more nonlinear distortion components in an output signal of the RF receiver chain to achieve a receiver linearity requirement, wherein the circuit components of the RF receiver chain are selected to achieve low power consumption in the digital equalizer.

BRIEF DESCRIPTION OF THE DRAWINGS

The above and further advantages of features described herein may be better understood by referring to the following description in conjunction with the accompanying drawings, in which like numerals indicate like structural elements and features in various figures. The drawings are not necessarily to scale, emphasis instead being placed upon illustrating the corresponding principles.

FIGS. 14 and 15 are schematic diagrams of an amplifier circuit having feedback that may be considered for use as a buffer amplifier during a receiver design process in accordance with an embodiment;

DETAILED DESCRIPTION

Figure 1A:
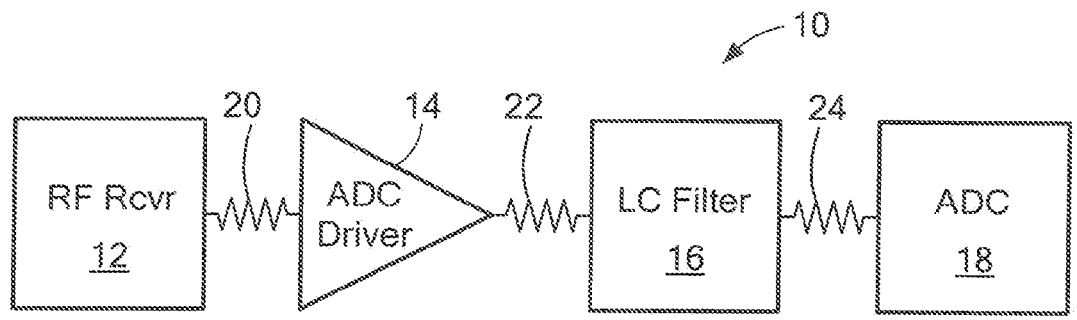
FIG. 1A is a schematic view of a conventional receiver with an LC filter.
Figure 1B:
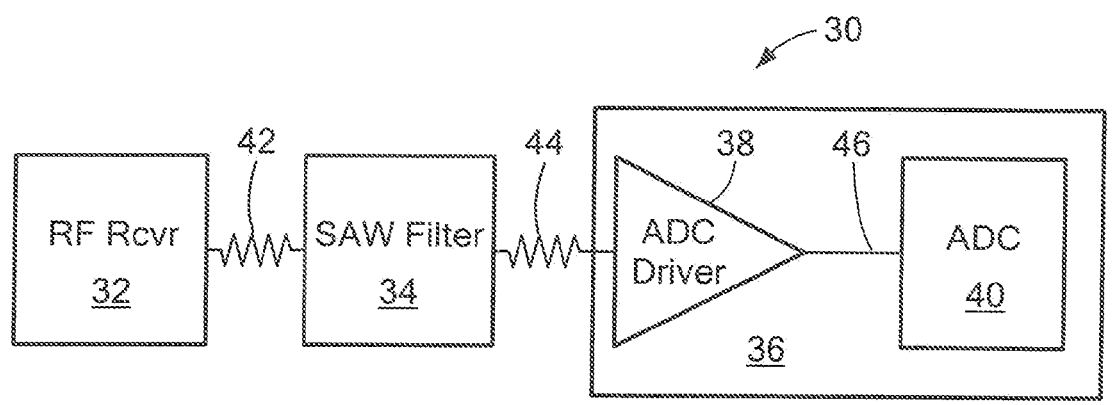
FIG. 1B is a schematic view of a conventional receiver with a SAW filter.
Figure 1C:
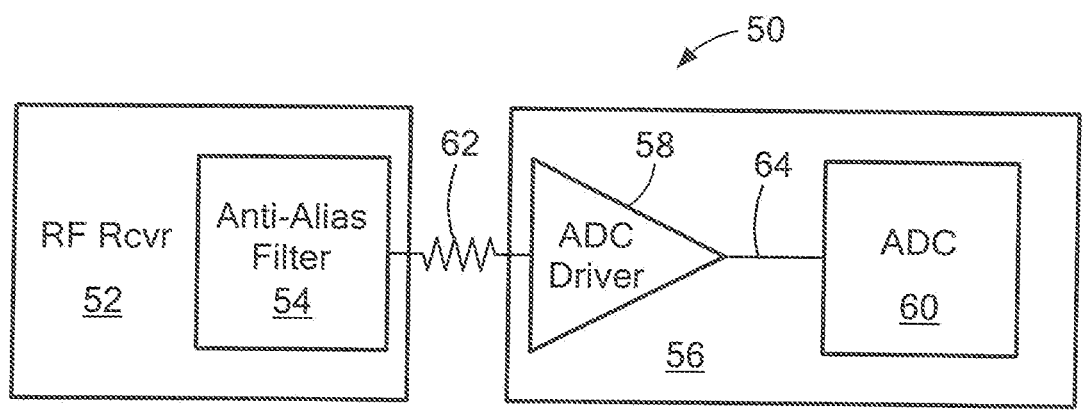
FIG. 1C is a schematic view of a conventional receiver with an anti-alias filter integrated with an RF receiver.
Figure 1D:
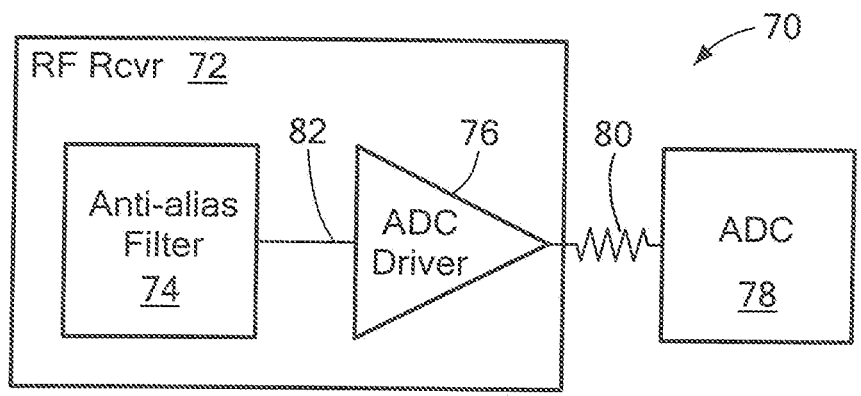
FIG. 1D is a schematic view of the conventional receiver with an anti-alias filter and an ADC driver integrated with an RF receiver.
Figure 2:
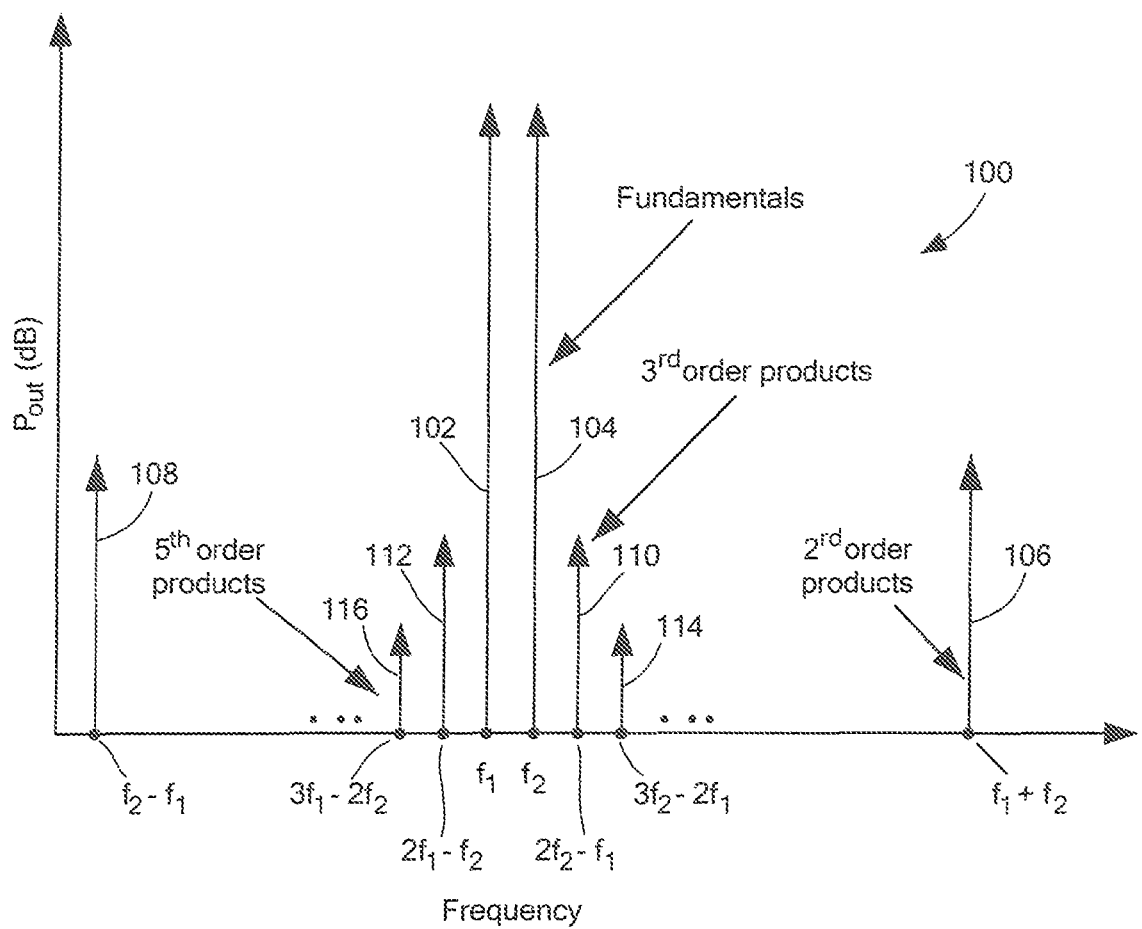
FIG. 2 is a graph of fundamental tones and associated harmonic tones.

Subject matter described herein relates to techniques and concepts for designing radio frequency (RF) receiver systems and other RF systems. The systems that are designed using these techniques may utilize both analog and digital compensation strategies to achieve a desired level of linearity performance. As will be described in greater detail, the design techniques consider analog and digital design together in a manner that can achieve linear performance with relatively low power consumption.

One digital compensation approach described herein optimizes an entire system comprising analog and digital components rather than treating the RF and analog component as a "black box" independent of the digital component (e.g. digital compensator). The sources of nonlinearity and other non-ideal characteristics() are identified and digital compensation is designed in parallel with the design of the RF and analog component, thereby making the digital compensation very power-efficient. For example a nonlinear system comprising a radio frequency (RF) component can be simultaneously optimized for one or more parameters including linearity, noise and power consumption. Various systems take advantage of this approach including a fully integrated RF receiver on a monolithic CMOS chip with a homodyne receiver, a frequency synthesizer, an ADC and a digital compensator. Other examples of systems include a homodyne receiver with digitally compensated I/Q mismatch and a wide tuning range frequency synthesizer with digital compensation to achieve low phase noise.

Embodiments of a digital compensation method and apparatus described herein provide for integrated components with improved linearity and minimized overall power consumption. In one embodiment, the integrated components include an RF receiver, an ADC driver, an anti-alias filter, an ADC or any combination thereof, followed by a digital compensator. In another embodiment, the integrated components include any nonlinear components followed by a digital compensator. In another embodiment, the integrated components include a plurality of groups of circuits, wherein each group includes at least one nonlinear circuit followed by a digital compensator. Such nonlinear systems typically include nonlinear polynomial distortion and a final analog to digital conversion, although they are not limited to such. In one example, a nonlinear system is converted to the digital domain, a digital compensation is performed and the resulting compensated digital output is converted back to the analog domain.

In a conventional RF system, nonlinearities must be equalized while maintaining a high SFDR, low total system power and without occupying a large area. The solutions shown in FIGS. 1A-1D do not satisfy the required power and area constraints, as further illustrated in Table 1. A digital compensator consumes power and area by itself, but can be used in conjunction with a nonlinear RF and analog system to reduce the total power and area of the RF system. Typically, the RF and analog system and the digital compensator are integrated into a monolithic semiconductor although the concepts described herein also apply to systems with separate components or to hybrid systems using multi-chip modules for example.

Figure 3:
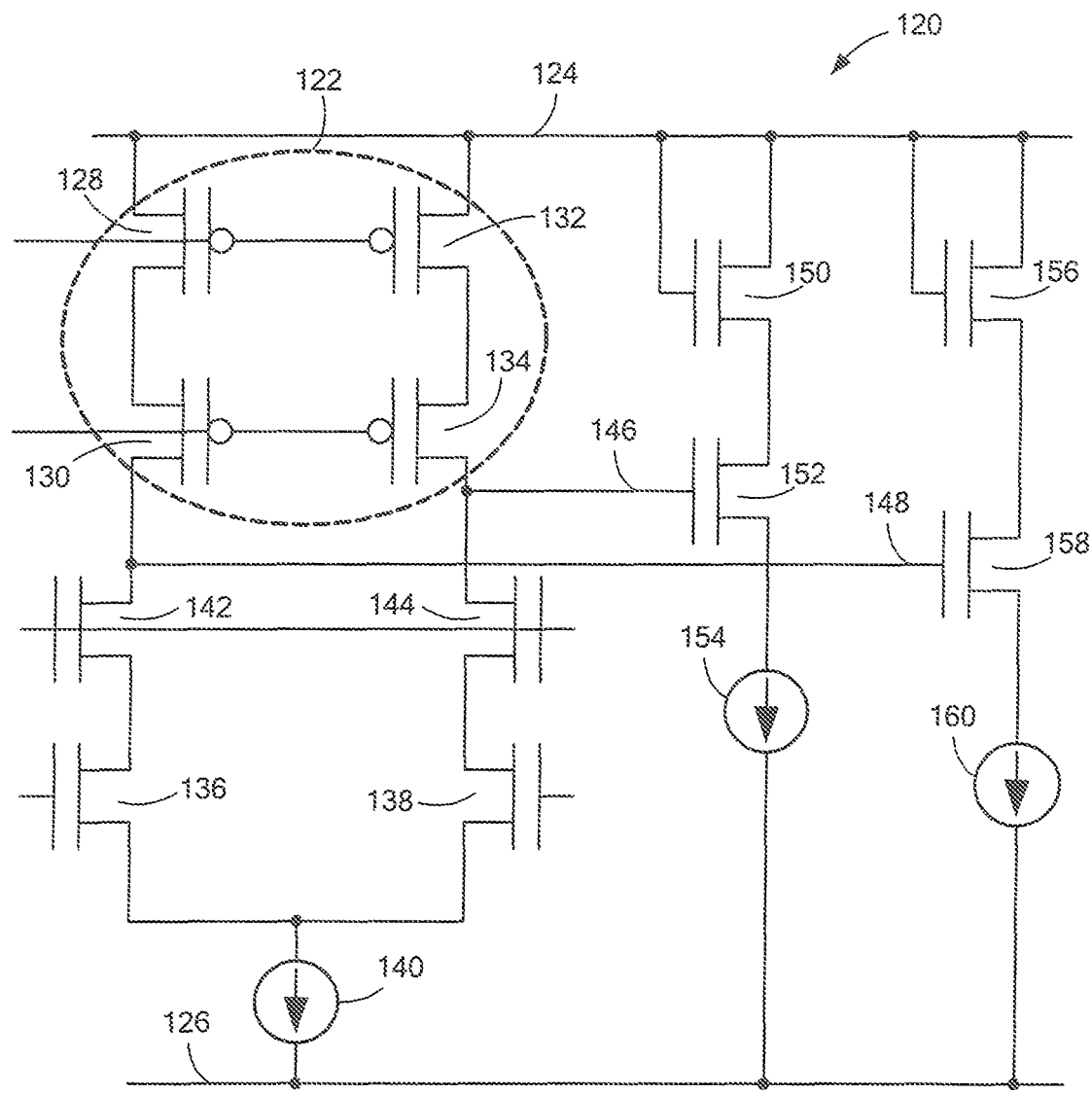
FIG. 3 is schematic view of a simplified operational amplifier with a cascode active load in an open loop configuration.

In a system integrated into a monolithic semiconductor (integrated), the anti-alias filter is typically implemented with either an operational amplifier (op-amp) based resistor-capacitor (RC) architecture or with a transconductance amplifier (gmC) architecture. A gmC filter can operate at higher frequencies than the op-amp based RC filter because the gmC filter operates without feedback (open-loop). In contrast, the op-amp based RC filter can provide higher SFDR if the op-amp has a large loop gain and unity-gain bandwidth. For example, a fifth-order Chebyshev filter with a 30 MHz passband typically requires an op-amp with a unity gain bandwidth exceeding 18 GHz and a corresponding op-amp loop gain of at least 30 dB. Referring to FIG. 3, if the supply voltage 124 is reduced to save power, or a CMOS implementation is used rather than BiCMOS, the transconductance will be lowered resulting in a reduction of the loop gain below 30 dB. This further degrades the required $OIP_3$ level below 45 dBm. Although the cascode active load boosts gain, it also contributes to significant nonlinearity and a corresponding reduction in the $OIP_3$ level.

Referring to FIG. 3, a typical CMOS op-amp 120 operates between an upper supply voltage 124 and a lower supply voltage 126. A cascode load 128 is formed by PMOS transistors 128, 130, 132 and 134. An input transistor 136 and a complementary input transistor 138 each sink current through the current bias 140 from the cascode load 122 to provide an output 146 and a complementary output 148. A pair of transistors 142 and 144 can decouple the cascode load 122 and the transistors 136 and 138 to reduce power when the op-amp 120 is inactive. The output 146 is buffered by transistor 152, a load 150 and a current source 154. Similarly, the complementary output 148 is buffered by transistor 158, a load 156 and a current source 160.

A nonlinear characteristic is a deviation from a linear relationship between an input and an output of a system or circuit. A weak nonlinear response is manifest as an output with harmonics and intermodulation terms as well as the fundamental tone of interest. If the nonlinearity becomes stronger, the gain of the fundamental tone will be reduced and more energy will transfer to the harmonics and intermodulation terms. Although using a digital compensator can reduce many nonlinear effects, memory effects in the circuit make compensation more difficult. Memory effects change the nonlinear behavior of the circuit based on the state circuit. For example, hysteresis, delays and filtering effects can cause the nonlinear behavior of the circuit to change over time. Other issues that cause memory effects are device (e.g. transistor) heating and trapping effects. Digital compensation of memory effects can be accomplished in part with delay elements that change the compensation as a function of time.

Figure 4:
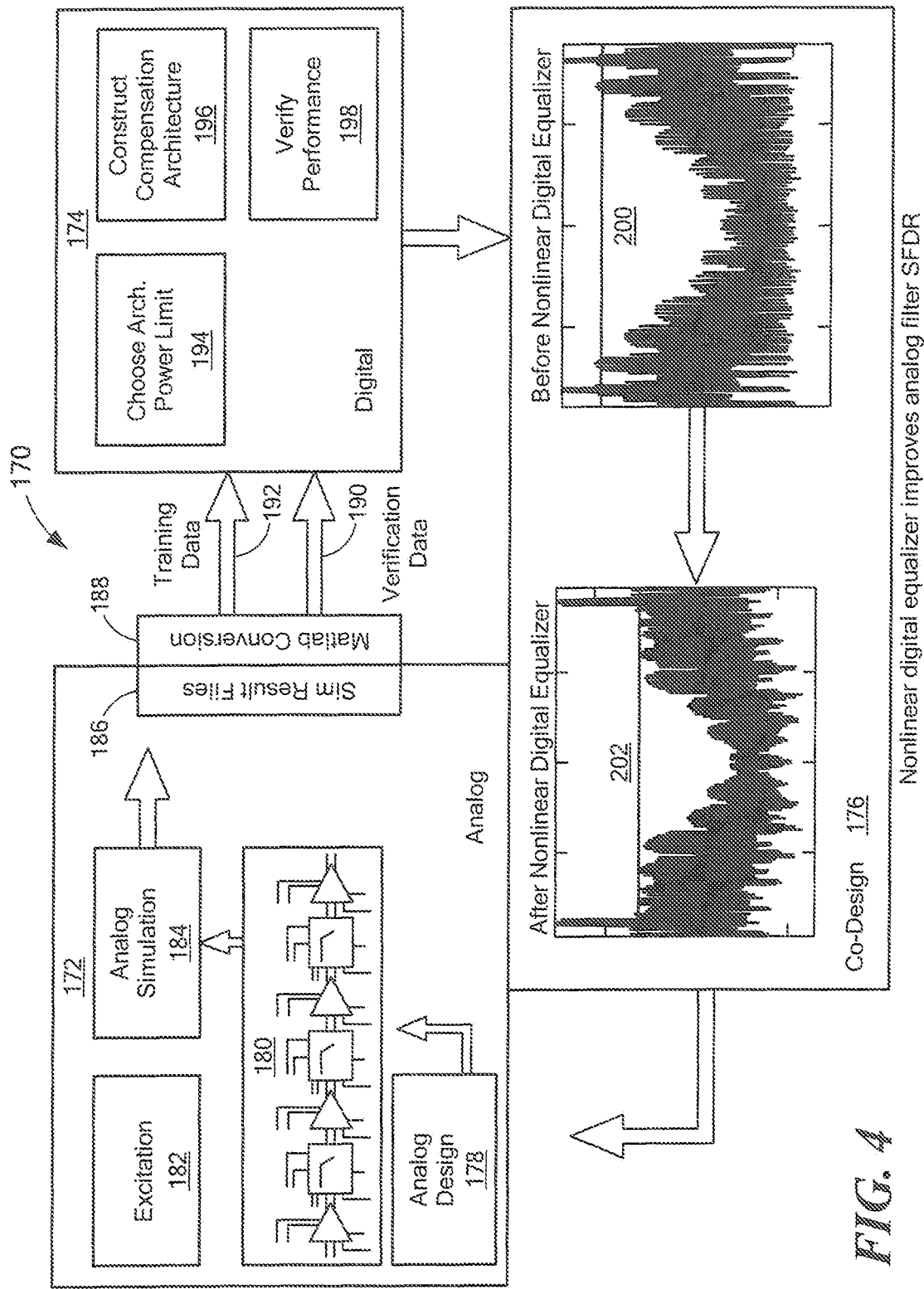
FIG. 4 is a schematic view of a design process for a digital compensation system.

The design process 170 shown in FIG. 4 is a new approach to designing a nonlinear system with a digital compensator that satisfies the need for a power and space efficient system with a nonlinearity substantially equal to the required 45 dBm level described above. The approach includes iteratively performing analog design 172 of a nonlinear system 180, performing digital design 174 of digital compensator (or equalizer) and comparing 176 the nonlinear distortion of the nonlinear system 180 before adjusting the digital compensator 200 with the nonlinear distortion after adjusting the digital compensator 202 until the desired nonlinearity levels are achieved.

The analog design 172 of the nonlinear system 180 includes designing 178 the various circuits of the nonlinear system 180, applying a stimulus or excitation 182 to the nonlinear system 180, simulating 184 the output of the nonlinear system 180 in response to the excitation 182 and capturing simulation results files 186. The simulation results files 186 are converted 188, with MATLAB™. for example, into training data 192 and verification data 190. The digital design 174 includes choosing an architecture power limit 194 for the combination of the nonlinear system 180 and the digital compensator, constructing 196 the digital compensator and verifying 198 the performance of the digital compensator by simulating the output of the digital compensator to determine if the nonlinear effects of the nonlinear system 180 are properly equalized.

The design process 170 is iterative beginning with identifying nonlinear circuit parameters (e.g. the cascode load 122 in FIG. 3). Next, a series of frequency tones (or stimuli or excitation) are chosen to maximize the nonlinear behavior of the chosen circuit parameters and applied as excitation 182 to the nonlinear system 180. In one example, the circuit parameters are sorted to first choose the circuit parameter with the most significant nonlinear effect on the nonlinear system 180. After stimulating the most significant circuit parameter and generating a digital compensation circuit, the reduction of nonlinearity and the total system power consumption are measured. If the total system power target is not met, the nonlinear circuit parameter is either made more linear or less linear resulting in a simpler (and lower power) digital compensator or a more complex digital compensator respectively. For example, a bias current is increased thereby improving the gain and linearity of an analog nonlinear system but also increasing the power consumption of the analog nonlinear system. By iteratively adjusting the nonlinear circuit parameter and then constructing a digital compensator the nonlinearity of the nonlinear system can be satisfied while reducing the total system power because an optimal balance of power consumption between the analog and digital circuits is achieved.

If the total system power consumption is not met after iteratively adjusting the most significant nonlinear circuit parameter and reconstructing the digital compensator, the next most significant nonlinear circuit parameter is chosen and iterated upon in the same manner as the first nonlinear circuit parameter. One or more circuit parameters are iteratively adjusted until the total power consumption and nonlinear performance goals are met. In another example, the order of nonlinear circuit parameters is chosen based on how significantly each circuit parameter affects the analog nonlinear system power consumption rather than nonlinearity.

The applied excitation 182 is a series of frequency tones in one example, with the nonlinearity measured as the total harmonic distortion of the nonlinear system. In another example, the excitation 182 is a series of closely spaced frequency tone pairs with the nonlinearity measured as the third order intercept. In one embodiment, the pair of frequency tones is ramped from 3 MHz to 40 MHz with a tone spacing of 0.08 MHz to 20 MHz producing 124 sets of tones.

Figure 5:
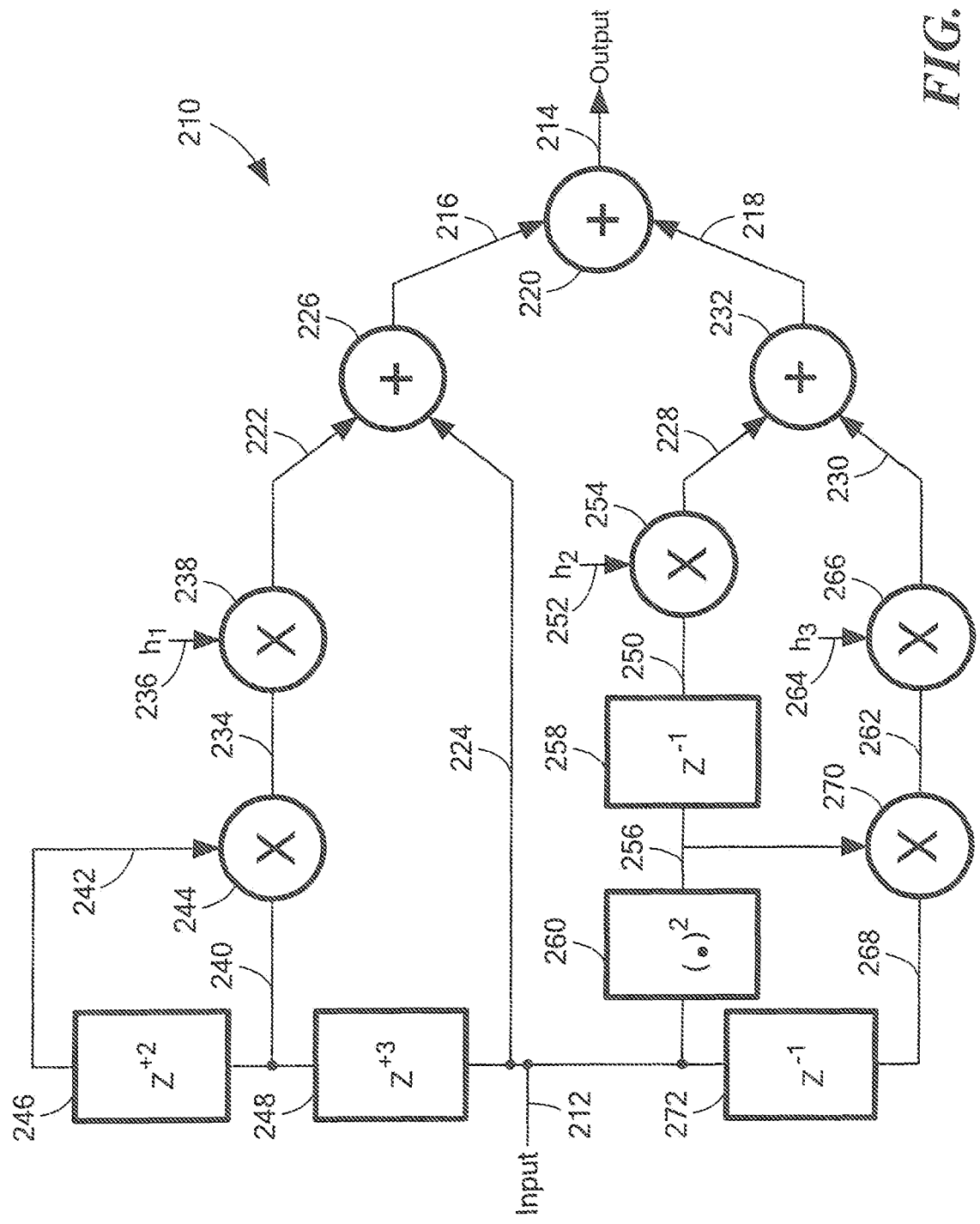
FIG. 5 is a schematic view of a polyphase nonlinear equalizer architecture for a digital compensator.

FIG. 5 shows a digital compensator 210 used in one of the preferred embodiments. The digital compensator 210 comprises the weighted sum of products of time-delayed values from the output of the nonlinear system 180. Accordingly, the digital compensator 210 captures the harmonic and intermodulation terms as well as the corresponding memory effects. Reduction of memory effects is desirable because the complexity and power consumption of the digital compensator grows rapidly with increased memory effects. In the design process 170 shown in FIG. 4, the analog nonlinear system 180 is preferentially designed to reduce memory effects through choice of architecture and components for example. The reduction of memory effects permits the reduction of digital compensator coefficients to the space of the generalized memory polynomial, although other coefficient spaces can be used. For example, a Volterra kernel can also be used. The Volterra kernel is a highly comprehensive nonlinear model but is combinatorial thus not well suited for real-time implementation. The generalized memory polynomial is further reduced in complexity by using a constrained optimization procedure to select the Individual coefficients. A number of optimization procedures are used in various embodiments, including greedy techniques and convex optimization techniques.

The digital compensator 210 in FIG. 5 has an input 212, which communicates with the output of the nonlinear system 180. The digital compensator 210 produces an output 214, which is a substantially linearized version of the output of the nonlinear system 180. In the embodiment shown in FIG. 5, the output 214 is the sum 220 of values 216 and 218. The value 216 is the sum 226 of values 222 and 224. The value 222 is the product 238 of value 234 and coefficient 236. The value 234 is the product 244 of value 240 and 242. The value 242 is a time advanced 246 of 240. The value 240 is a time advanced 248 of input 212. Time advancement is relative to the sampling time of input 212, so the time advance 246 and 248 are accomplished by a corresponding delay in input 212. The value 224 is considered a "feed through" path while the 222 value is a "second order" path because it is derived from the input 212 multiplied twice (once by 244 and once by 238).

improve linearity and will result in a correspondingly marginal reduction in the digital compensator power, the total system power will be very large.

Figure 7:
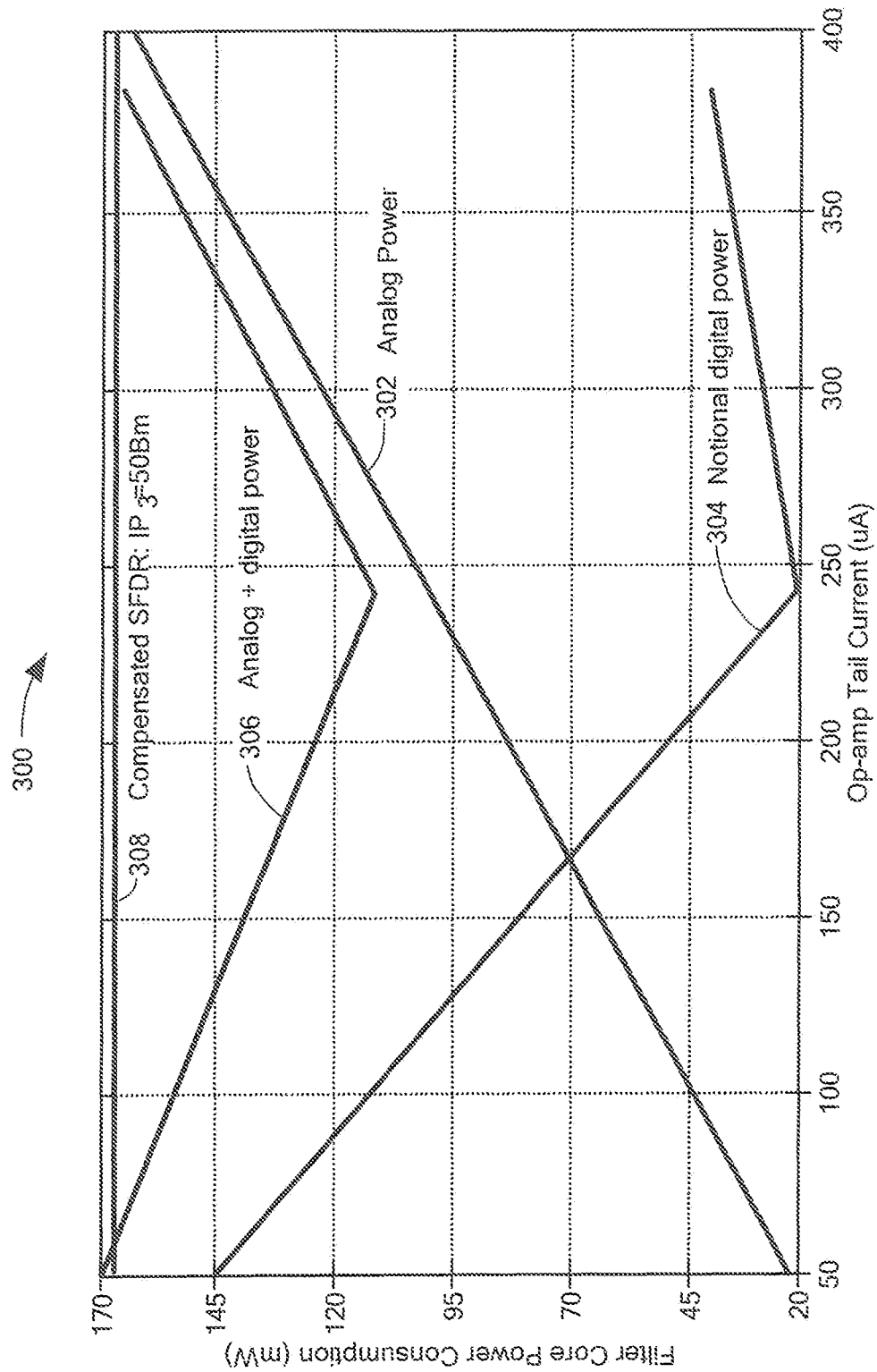
FIG. 7 is graph view of a power consumption of a nonlinear system and a digital compensator.

FIG. 7 further illustrates the tradeoff of analog and digital design parameters. For a given post-compensated linearity 308 of 50 dBm as measured by the third order intercept, the combined system consumes power due to the nonlinear analog system and the digital compensator. The analog power 302 increases linearly with an increase in the op-amp tail current. The notional digital power 304 decreases with an increase in op-amp tail current because the analog system nonlinearity improves and memory effects are reduced because of a corresponding improvement in unity gain bandwidth. The improvement in notional digital power 304 reaches an inflection point and degrades at very high levels of op-amp tail current. In this example, the total system power 306 including the nonlinear analog system and the digital compensator achieves minimum power at an op-amp tail current of approximately 240 uA.

Table 2 compares the performance of continuous time filters shown in Table 1 with the applicant's work. Specifically, the low pass filter is improved to an $OIP_3$ value of 36.5 dBm and further improved to an $OIP_3$ value of 43.6 dBm with the addition of the digital compensator (e.g. nonlinear digital equalizer).

TABLE 2

Typical anti-alias filter performance compared to Applicant's work

| Anti-alias filter | $OIP_3$ In-band | 3 dB cut-off frequency | | Gain | | Stop-band rejection | Input referred noise | Power | Technology |
|---|---|---|---|---|---|---|---|---|---|
| #1 | 19.5 dBm | 1.92 | MHz | 8.5 | dB | 63 dB | Integrated 46 uVrms | 11.6 mW | 0.8 μm BiCMOS |
| #2 | 24 dBm | 1, 2.2 or 11 | MHz | -6-> 68 | dB | Not Reported | 5 nV/√Hz | 55 mW | 0.13 μm CMOS |
| #3 | 18.5 dBm | 15 | MHz | 0 | dB | 60 dB | 15.2 nV/√Hz or 50 nV/√Hz for low power | 184.8 mW or 17.8 mW | 0.6 μm CMOS |
| (Low pass portion) Applicant's work | 36.5 dBm | 28.2 | MHz | 49 | dB | 92 dB | 8.4 nV/√Hz | 79 mW (filter only) | 0.13 μm SiGe BiCMOS |
| Applicant's work with nonlinear digital equalizer | 43.6 dBm | 28.2 | MHz | 49 | dB | 92 dB | 8.4 nV/√Hz | 81.7 mW (filter + nonlinear digital equalizer) | 0.13 μm SiGe BiCMOS |

The value 218 is the sum 232 of values 228 and 230. The value 228 is the product 254 of value 250 and coefficient 252. The value 250 is a time delay 258 of value 256. The value 256 is the square product 260 of input 212. The value 230 is the product 266 of value 262 and coefficient 264. The value 262 is the product 270 of value 256 and 268. The value 268 is a time delay 272 of the Input 212. The value 230 is a "third order" path because the value 230 is multiplied three times (once by 266, once by 270 and once by 260).

Figure 6A:
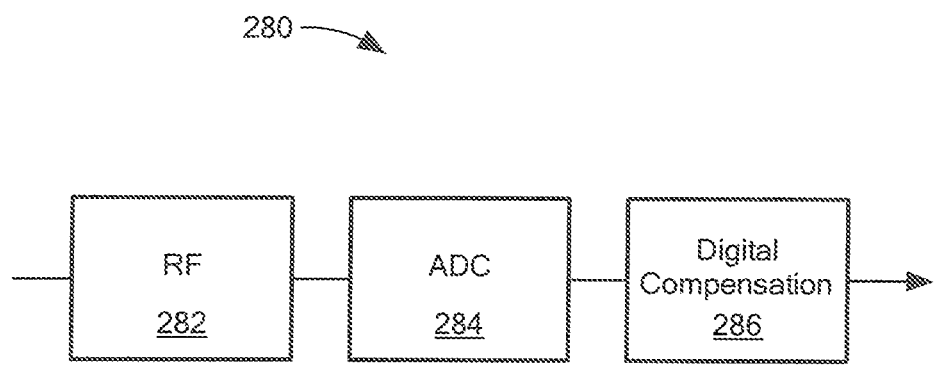
FIG. 6A is a schematic view of a nonlinear receiver with a digital compensator.
Figure 6B:
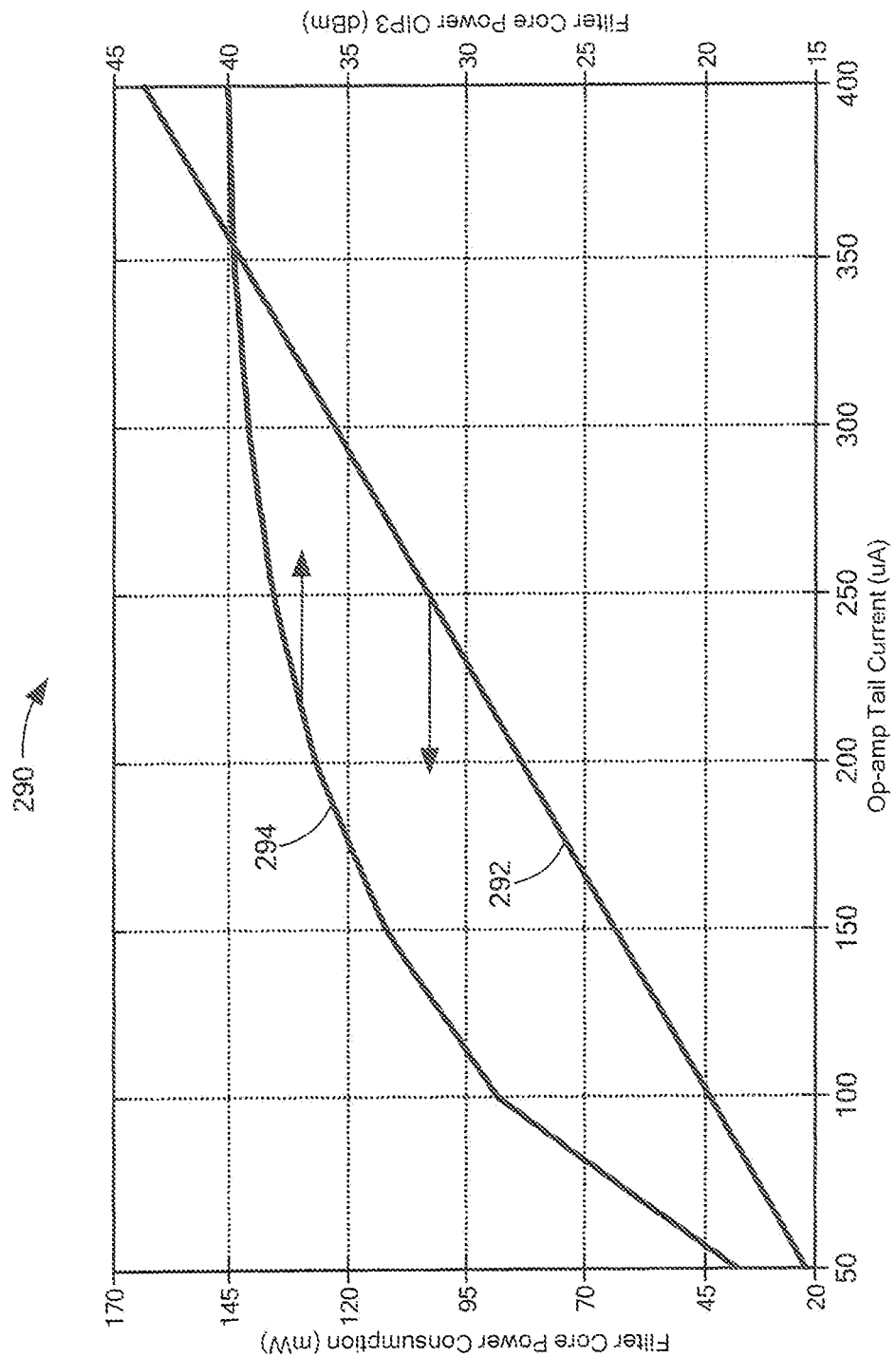
FIG. 6B is a graph view of a power consumption and third order intercept of an uncompensated nonlinear receiver.

FIG. 6A is a generalized version of a nonlinear system comprising an RF receiver 282 and an ADC 284 followed by a digital compensator 286. FIG. 6B shows the tradeoff of power consumption and improved linearity for an nonlinear system (e.g. the operational amplifier in FIG. 3). As the op-amp tail current (e.g. current source 140 in FIG. 3) is increased, the op-amp power consumption 292 increases linearly however the improvement in linearity 294 is sublinear. Although large values of op-amp tail current will marginally As will be appreciated by one skilled in the art, aspects of the present invention may be embodied as a system, method, or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more non-transitory computer readable medium(s) having computer readable storage program code embodied thereon.

Any combination of one or more computer readable medium(s) may be utilized. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list)

of the computer readable storage medium would include the following: a portable computer diskette, a hard disk, a random access memory (RAM), a read-only memory (ROM), an erasable programmable read-only memory (EPROM or Flash memory), a portable compact disc read-only memory (CD-ROM), an optical storage device, a magnetic storage device, or any suitable combination of the foregoing. In the context of this document, a computer readable storage medium may be any tangible medium or media that can store a program for use by or in connection with an instruction execution system, apparatus, or device.

Program code embodied on a computer readable storage medium may be transmitted using any appropriate medium, including but not limited to wireless, wire-line, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Figure 8:
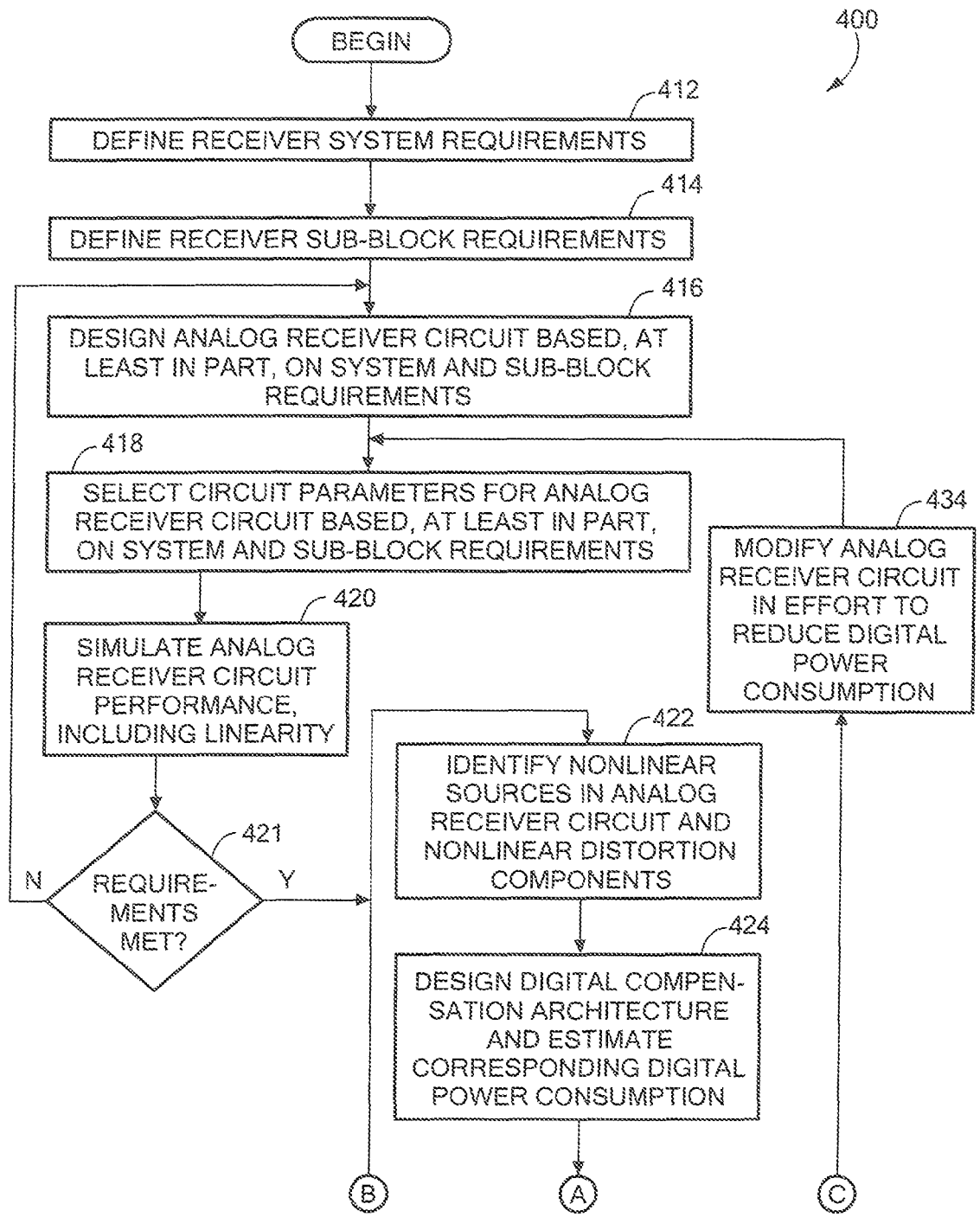
FIGS. 8 and 9 are portions of a flowchart illustrating a method for use in designing a radio frequency (RF) receiver system in accordance with an embodiment.
Figure 9:
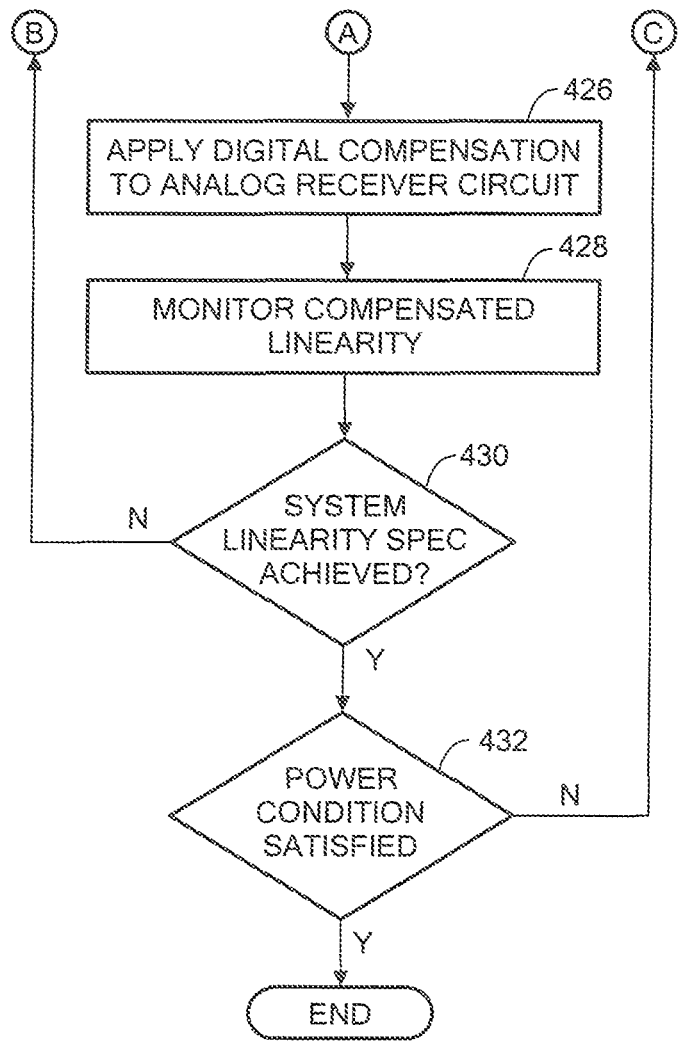

FIGS. 8 and 9 are portions of a flowchart illustrating a method 400 for use in designing a radio frequency (RF) receiver system in accordance with an embodiment. The method 400 is capable of generating receiver system designs that achieve a desired level of linearity, while consuming significantly less power than receivers designed using conventional design techniques. In general, low power RF receivers are highly desirable. Such receivers are particularly desirable for use in battery powered communication applications, where low power consumption leads to longer periods between battery recharge operations (e.g., cell phones, smart phones, walkie talkies, pagers, satellite communicators, etc.).

As shown in FIG. 8, the method 400 may begin with the definition of system requirements for the receiver system being designed (block 412). The system requirements may include a designation of performance parameters for the receiver system that may include, for example, selectivity, bandwidth, linearity, sensitivity, noise figure, dynamic range, signal-to-noise ratio (SNR), and/or other parameters. Requirements for individual sub-blocks of the receiver system (which may include individual components or groups of components of the analog receiver chain) may also be defined (block 414). For example, there may be individual linearity or bandwidth requirements for an amplifier, frequency converter, filter, VGA, and/or other elements or groups of elements within the receiver chain. In some implementations, some or all of the system and/or sub-block requirements may be specified by a customer, a standard, and/or government regulation.

An analog receiver system architecture may next be selected based, at least in part, on the system and/or sub-block requirements (block 416). The selection of an initial analog receiver architecture may include considerations such as, for example, whether a pre-selector should be used, how many frequency conversion stages should be used (e.g., direct conversion receiver, super-heterodyne receiver, etc.), how many filter stages should be used, how many amplification stages should be used, whether separate in-phase (I) and quadrature (Q) channels should be provided, whether a trans-impedance amplifier (TIA) should be used, whether analog circuit linearization techniques should be implemented for one or more components of the receiver chain and, if so, what types of analog linearization techniques to use, and/or other considerations.

Circuit parameters and operational conditions may also be selected for the analog receiver system based, at least in part, on the system and/or sub-block requirements (block 418). The circuit parameters may include parameters such as, for example, the transconductance ($g_m$) of one or more transistor devices, the sizes of transistor devices (e.g., length, width, etc.), bias levels of active devices within the receiver chain (e.g., $I_{bias}$, etc.), power levels at various points within the receiver chain (e.g., at the output of an LNA, at the input or output of one or more VGAs, at the Input or output of a buffer amplifier, etc.), and/or other parameters. The bias levels and power levels may be selected, for example, to keep one or more of the components within the analog circuitry within a desired region of operation. For example, in at least one example implementation, the bias levels and drive levels of all amplifiers within the analog receiver chain may be set so that they do not exceed the 1-dB gain compression point under any circumstances. By limiting operational parameters in this manner, digital nonlinearity compensation may be simplified while meeting high SFDR. In another example, the analog receiver chain can be designed beyond 1-dB gain compression point when SFDR is not as demanding.

After the initial analog architecture and analog circuit parameters have been selected, the performance of the analog receiver circuit may be simulated to determine whether selected system and/or sub-block requirements have been achieved (block 420). If the requirements have not been achieved, changes may be made to the architecture and/or circuit parameters until desired analog performance is achieved for those requirements (block 421). Because digital nonlinearity compensation is to be used, however, the system linearity requirement does not need to be satisfied at this point.

After an analog design is determined, digital design techniques for reducing the level of one or more nonlinear distortion components (e.g., inter-modulation (inter-mod) products, harmonics, etc.) in an output of the analog receiver circuit may be implemented. As a first step in the digital design process, nonlinear distortion components in the analog output signal, as well as the sources of these components, may be identified (block 422). In some implementations, a calibration procedure may be used to identify the nonlinear distortion components being generated in the receiver. The calibration procedure may involve, for example, applying a series of two-tone signals to an input of the analog receiver circuit and monitoring, recording, and analyzing resulting output signals.

Based on the identified nonlinear components and sources, a digital compensation architecture may be designed for reducing or eliminating the nonlinear distortion components in the output of the analog receiver circuit (block 424). In at least one embodiment, the digital compensation circuitry may include one or more analog to digital converters (ADCs) coupled to an output of the analog receiver chain(s) followed by digital processing circuitry (e.g., a digital equalizer, etc.) that is configured to digitally suppress one or more of the nonlinear distortion components within the output signal of the analog receiver chain. The power consumption of the resulting digital compensation circuitry may be estimated at this point.

Referring now to FIG. 9, the digital compensation architecture may next be applied to the analog receiver system (block 426). The linearity performance of the modified system may then be simulated (block 428). If the modified system does not achieve the specified system linearity requirement (block 430-N), then the method 10 may repeat the digital design process to make modifications to the digital compensation architecture. That is, nonlinear distortion components may again be identified (block 422) and adjustments may be made to the digital compensation architecture based thereon (block 426). This process may be repeated until the system linearity requirement has been achieved or some other condition has been met (e.g., a maximum number of design iterations has occurred, etc.). Each time the digital compensation architecture is modified, the power consumption of the modified architecture may again be estimated.

When the digitally modified system achieves the specified system linearity requirement (block 430-Y), then it may next be determined whether a particular power condition of the receiver system has been satisfied (block 432). As will be described in greater detail, the power condition may include any condition that is selected to achieve reduced power consumption in the digital compensation circuitry itself or the RF receiver design as a whole. If the power condition is not satisfied (block 432-N), then modifications may be made to the analog circuitry in an effort to achieve further reduction in power consumption in the receiver (block 434, FIG. 8). In some implementations, the modifications to the analog circuitry may include modifications to only a single component of the analog receiver chain. For example, a type of analog linearity compensation being used in a particular component (e.g., an amplifier, etc.) may be changed. In other implementations, changes in more than one component may be made.

After the modifications have been made to the analog circuitry, the performance of the modified analog circuitry may then be simulated (block 420) and possibly further refined (block 421). As before, digital compensation may then be designed and applied for the modified analog circuitry until the system linearity requirement is again achieved (block 430-Y). The power condition may then be re-checked (block 432). This process may then be repeated until a digitally compensated receiver design is achieved that meets the linearity requirement while satisfying the power condition.

As described above, the power condition is a condition that is selected to achieve an overall receiver design that meets all of the design requirements, while consuming a reduced amount of power. In some implementations, reducing power consumption in the digital compensation circuitry may be a primary concern. However, in other embodiments, the power consumption of the entire receiver may be considered (i.e., both analog and digital portions). Thus, in some implementations, a design that uses slightly more digital power and a lot less analog power may be preferred over a design that reduces digital power substantially but consumes more power overall. In one approach, the power condition may be to achieve a minimum amount of power consumption in the digital compensation circuitry (or the receiver as a whole). However, it may be difficult or impossible to determine whether a "minimum" power consumption has been achieved in a particular instance. Therefore, other types of power conditions may alternatively be specified. In one implementation, for example, the power condition may involve performing a predetermined number of design iterations that each changes the analog and digital circuit designs. After the predetermined number of iterations have been performed, the receiver design that achieved the lowest digital power consumption (or overall power consumption) may be selected. In another possible approach, a desired level of power consumption may first be selected and then analog/digital design iterations may be performed until this level of power consumption is achieved. This approach can be modified to include a maximum number of design iterations in case the desired level of power consumption cannot be achieved (or is too difficult to achieve). As will be appreciated, any number of alternative power conditions can be used in other implementations.

Figure 10:
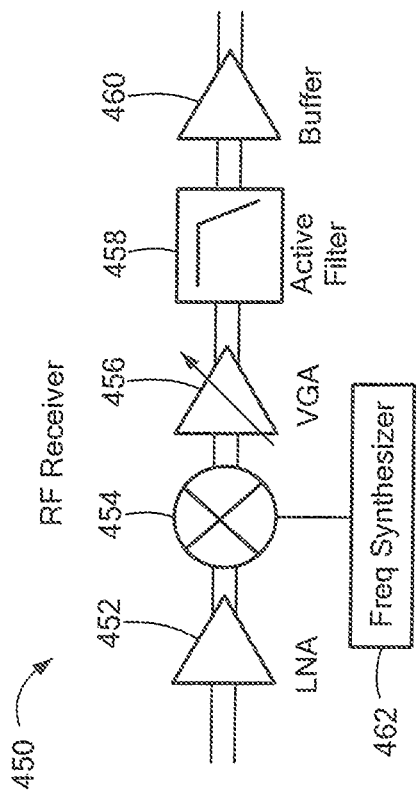
FIG. 10 is a block diagram illustrating an example RF receiver architecture that may be considered during a receiver design process in accordance with an embodiment.

FIG. 10 is a block diagram illustrating an example RF receiver architecture 450 that may be considered during a design process in accordance with an implementation. The RF receiver architecture 450 is an example of a direct conversion receiver that includes a single frequency conversion stage that down-converts a received signal directly to base band. As shown, the RF receiver architecture 450 may include, for example, a low noise amplifier (LNA) 452, a mixer 454, a variable gain amplifier (VGA) 456, an active filter 458, a buffer amplifier 460, and a frequency synthesizer 462. The LNA 452 is a high gain amplifier having a low noise figure that is operative for amplifying a signal received from a wireless channel by an antenna (not shown). Mixer 454 is operative for down converting the output signal of LNA 452 to baseband. Frequency synthesizer 462 generates a local oscillator (LO) signal for mixer 454 to support the down-conversion. VGA 456 amplifies the baseband signal output by mixer 454 by a controllable gain amount. Active filter 458 may include, for example, a low pass filter for filtering the amplified baseband signal before it reaches buffer amplifier 460. Buffer amplifier 460 then provides a final analog amplification stage for the analog architecture 450.

Figure 11:
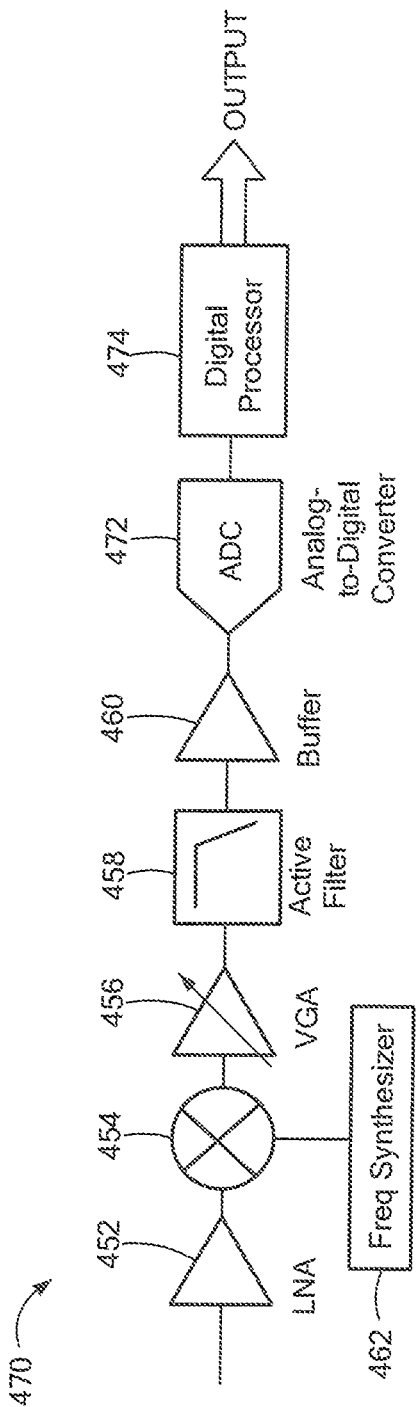
FIG. 11 is a block diagram illustrating an example RF receiver architecture with digital compensation circuitry that may be considered during a receiver design process in accordance with an embodiment.

FIG. 11 is a block diagram illustrating an RF receiver architecture 470 having digital compensation circuitry. As shown, the receiver architecture 470 includes the RF receiver architecture 450 of FIG. 10 with an ADC 472 and a digital processor 474 added to an output thereof. ADC 472 is operative for digitizing the output signal of buffer amplifier 460 to support digital processing in digital processor 474. Digital processor 474 includes digital suppression circuitry (e.g., a digital equalizer, etc.) that is capable of suppressing one or more of the nonlinear distortion components within the output signal of the analog receive chain. In general, for a given RF receiver design, the complexity of digital processor 474 (e.g., the number of filter taps used, etc.) will typically dictate the amount of suppression achieved in the nonlinear signal components of the output signal. The amount of power consumed by processor 474 will typically increase with increased complexity. In addition, as will be described in greater detail, it has been discovered that the digital complexity required in digital processor 474 to achieve a desired linearity performance for a receiver system (e.g., receiver system 470) may not necessarily depend upon the linearity performance of the analog receiver chain being used. That is, in many cases, RF receiver designs having better linearity performance may require more complex digital compensation circuitry than other RF receiver designs having poorer linearity performance. The receiver design methods described herein (e.g., method 400 of FIGS. 8 and 9, etc.) are capable of finding a combination of analog and digital circuitry that achieves a desired linearity performance overall, while consuming a reduced, or in some cases minimal, amount of power.

It should be appreciated that RF receiver architecture 450 of FIG. 10 represents one possible RF receiver architecture that may be considered for use during a design process in accordance with an embodiment. Many alternative architectures, including much more complex receiver architectures, may be selected in other implementations. As described above, the particular architecture that is selected will depend, at least in part, on the particular system and/or sub-block requirements of the system.

In some implementations, a digital equalizer may be used as part of the digital compensation architecture to reduce nonlinear distortion components in the output signal of the analog receiver chain. In RF systems having memory effects (e.g., RF receivers, etc.), a general nonlinear finite impulse response (FIR) model that may be used to model nonlinear operation is the Volterra series, which may be expressed as:

$$y_{NL}(n) = \sum_{p=0}^{P} \sum_{m_1=0}^{M} \ldots \sum_{m_p=0}^{M} h_p(m_1, \ldots, m_p) \prod_{l=1}^{p} x(n-m_l).$$

where P is the polynomial order, M is the memory depth, hp are the Volterra coefficients, x is the input, and $y_{NL}$ is the output. This model generalizes the linear FIR filter to polynomial combinations of the input. While this representation captures general nonlinear behavior, its complexity is combinatorial in memory depth (M). To enable use within real-time systems, some simplification of this model may be needed. In one possible simplification approach, a full coefficient space of the model may be divided into subspaces, and only a few of the subspaces may be selected for use in the equalizer. In addition, to achieve power savings, an equalizer may be designed that operates over only a portion of the coefficient space of the Volterra kernel, rather than the entire space.

When designing a digital compensation architecture, a digital equalizer circuit may be selected that uses coefficients of a generalized memory polynomial (GMP) architecture (such as the architecture described in "A Generalized Memory Polynomial Model for Digital Predistortion of RF Power Amplifiers," by Morgan et al., *IEEE Trans. Signal Process.*, Vol. 54, No. 10, 2006). In this model, the nonlinear output (neglecting the constant $h_0$ and linear $h_1$ terms) may be given by:

$$y(n) = \sum_{p=2}^{P} \sum_{m_1=0}^{M_1} \sum_{m_2=0}^{M_2} h_p(m_1, m_2) x(n-m_1) x^{p-1}(n-m_1-m_2)$$

This model is restricted to the coefficients lying on a 2-dimensional plane within the larger coefficient space. The model limits flexibility in that coefficients may no longer be chosen from arbitrary portions of the space, but it provides a simple, power-efficient implementation. From the set of possible GMP coefficients, a small number of non-zero coefficients may be selected (e.g., up to five in one implementation) using a sparse signal estimation procedure. In one implementation, a procedure is used that is a modified version of the orthogonal matching pursuit (OMP) algorithm described in "Signal Recovery From Random Measurements via Orthogonal Matching Pursuit," by Tropp et. al, *IEEE Trans. Inform. Theory*, Vol. 53, No. 12, pp. 4655-4666, December 2007. It has been empirically observed that allowing the procedure to choose individual coefficients permits a greater initial dynamic range improvement to be achieved with few coefficients in a manner that is sufficient to compensate for nonlinearity in many analog receiver designs.

Figure 12:
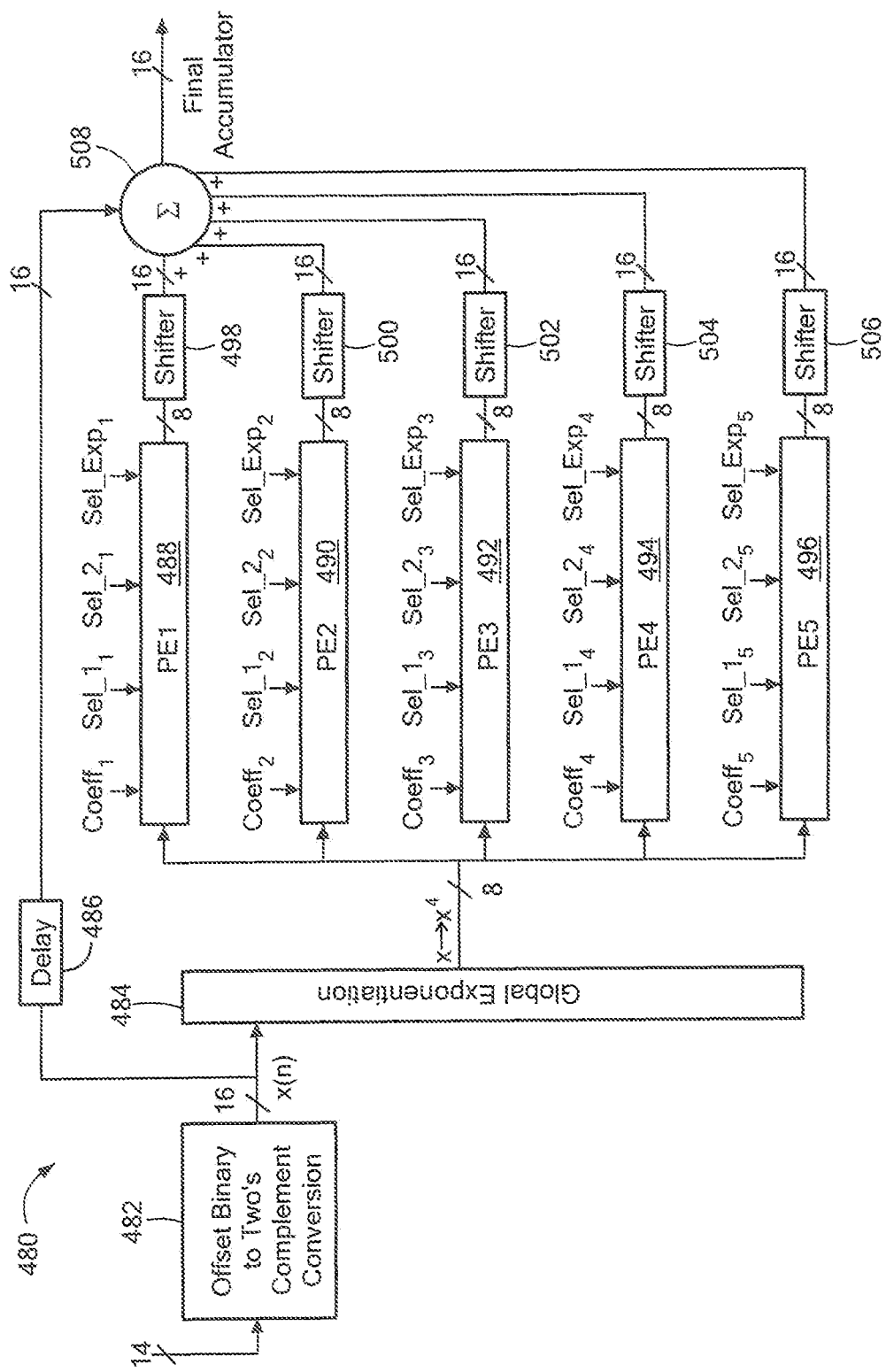
FIG. 12 is a block diagram illustrating an example digital equalizer circuit that may be used to provide nonlinearity compensation for an RF receiver design in accordance with an embodiment.

FIG. 12 is a block diagram Illustrating a digital equalizer circuit 480 that may be used to provide nonlinearity compensation for an RF receiver design (or other circuit designs) in accordance with an embodiment. Digital equalizer circuit 480 may be used within, for example, digital processor 474 of FIG. 11 or in other systems. In some embodiments, digital equalizer circuit 480 may be configured to select and use a small number of non-zero GMP coefficients using a sparse signal estimation procedure, as described above. As illustrated, digital equalizer circuit 480 comprises: a two's complement converter 482; a global exponentiation unit 484; a delay unit 486; a plurality of processing elements (PEs) 488, 490, 492, 494, 496; a plurality of digital shifters 498, 500,

502, 504, 506 corresponding to the plurality of processor elements; and an output accumulator 508. As described previously, a signal output by an RF receiver chain may first be converted to a digital format within an analog to digital converter (ADC) before being input into digital equalizer circuit 480. Two's complement converter 482 is operative for converting the input data to a two's complement format, if needed. The output of two's complement converter 482 will be denoted as x(n) herein and, in at least one embodiment, is a 16-bit signal.

Global exponentiation unit 484 is operative for raising signal x(n) to powers ranging from 2 to 4 to provide polynomial combinations of the signal for processing (e.g., x(n) to $x^4(n)$). To save power in digital equalizer circuit 480, signal x(n) may be truncated to a particular number of most significant bits (MSBs) (e.g., 8 bits, etc.) before being applied to global exponentiation unit 484, in some embodiments. As will be described in greater detail, PEs 488, 490, 492, 494, 496 process the polynomial combinations output by global exponentiation unit 484 in a predetermined manner to each generate an 8-bit output signal. The 8-bit output of each PE 488, 490, 492, 494, 496 is then sign-extended and shifted (multiplied) in a corresponding shifter 498, 500, 502, 504, 506 to generate a 16-bit shifted output signal. The shifted outputs are then summed together with a delayed version of the uncompensated 16-bit signal x(n) in accumulator 508. The delayed version of x(n) is received from delay unit 486. The accumulator 508 is where the actual subtraction of non-linear effects from x(n) is taking place. The subtraction is achieved by the use of negating coefficients.

Figure 13:
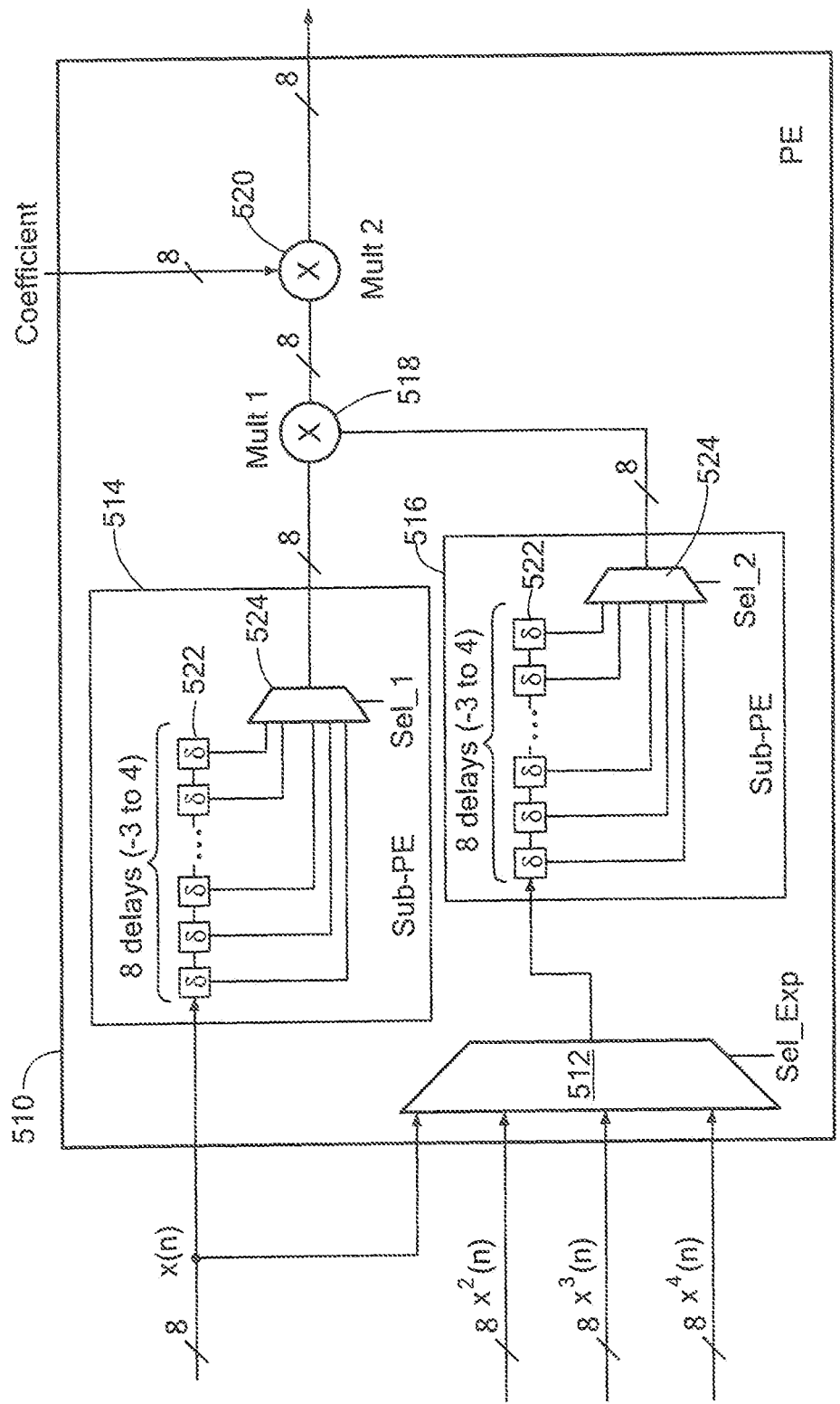
FIG. 13 is a block diagram of an example processing element that may be used within the digital equalizer circuit of FIG. 12 in accordance with an embodiment.

FIG. 13 is a block diagram of an example processing element 510 in accordance with an embodiment. Processing element 510 may be used within, for example, digital equalizer circuit 480 of FIG. 12 and/or other equalization circuits. As illustrated, processing element 510 includes: a multiplexer 512, first and second delay blocks (or sub-processing elements) 514, 516, and first and second multipliers 518, 520. Delay blocks 514, 516 are each operative for delaying an input signal by a desired amount. First delay block 514 delays the truncated (8-bit) version of input signal x(n) by a first delay amount. Second delay block 516 delays a truncated version of either the input signal x(n) or the second, third, or fourth powers of x(n) (as selected by multiplexer 512) by a second delay amount. The delayed output signals of first and second delay blocks 514, 516 are multiplied together in first multiplier 518 to form a first product. To conserve power, the first product may be truncated to a particular number of MSBs (e.g., 8-bits, etc.) in some embodiments. The first product may then be multiplied by a predetermined coefficient in second multiplier 520 to form a second product, which serves as the output signal of processing element 510.

In at least one implementation, each of the delay blocks 514, 516 may include a series of delay elements 522 and a multiplexer 524. The delay elements 522 may each have an output that is coupled to an input of multiplexer 524. A signal to be delayed is applied to an input of the series of delay elements 522 and allowed to propagate through the elements. Multiplexer 524 is then able to select an output signal of one of the delay elements 522 that has a desired delay amount for passage to an output. Other types of delay blocks may be used in other implementations.

The signal selected by multiplexer 512, the delay values used in first and second delay blocks 514, 516, and the coefficient used by second multiplier 520 may each be determined during a training operation to achieve a desired equalizer response for a corresponding equalizer (e.g., digital equalizer circuit 480 of FIG. 12). After training, control signals may be sent to the corresponding components of processing element 510 to configure the element. In general, each processing element in an equalizer will be independently configured to achieve a desired equalizer response.

It should be appreciated that digital equalizer circuit 480 of FIG. 12 and processing element 510 of FIG. 13 are merely examples of different circuits that may be used to perform digital compensation in various implementations. Many alternative compensation architectures may be used.

In method 10 of FIGS. 8 and 9, after an initial RF receiver has been designed, nonlinear distortion components within an output signal of the RF receiver are identified. A digital compensation architecture may then be designed to reduce the nonlinear components, and the power consumption of the digital compensation architecture is estimated. When an equalizer similar to the one of FIG. 12 is used as part of the digital compensation architecture, the power consumption may be estimated in a relatively straightforward manner. In such an implementation, the power consumption will primarily depend upon the order of the polynomial used, the number of delays used, and the number of processing elements used (which may each include delay blocks and multipliers). In one approach, an equation may be generated to estimate the power consumption based on these variables. As will be appreciated by persons of ordinary skill in the art, the specific technique for estimating the power consumption of the digital compensation circuitry will typically depend upon the digital compensation architecture used.

Figures 16, 17:
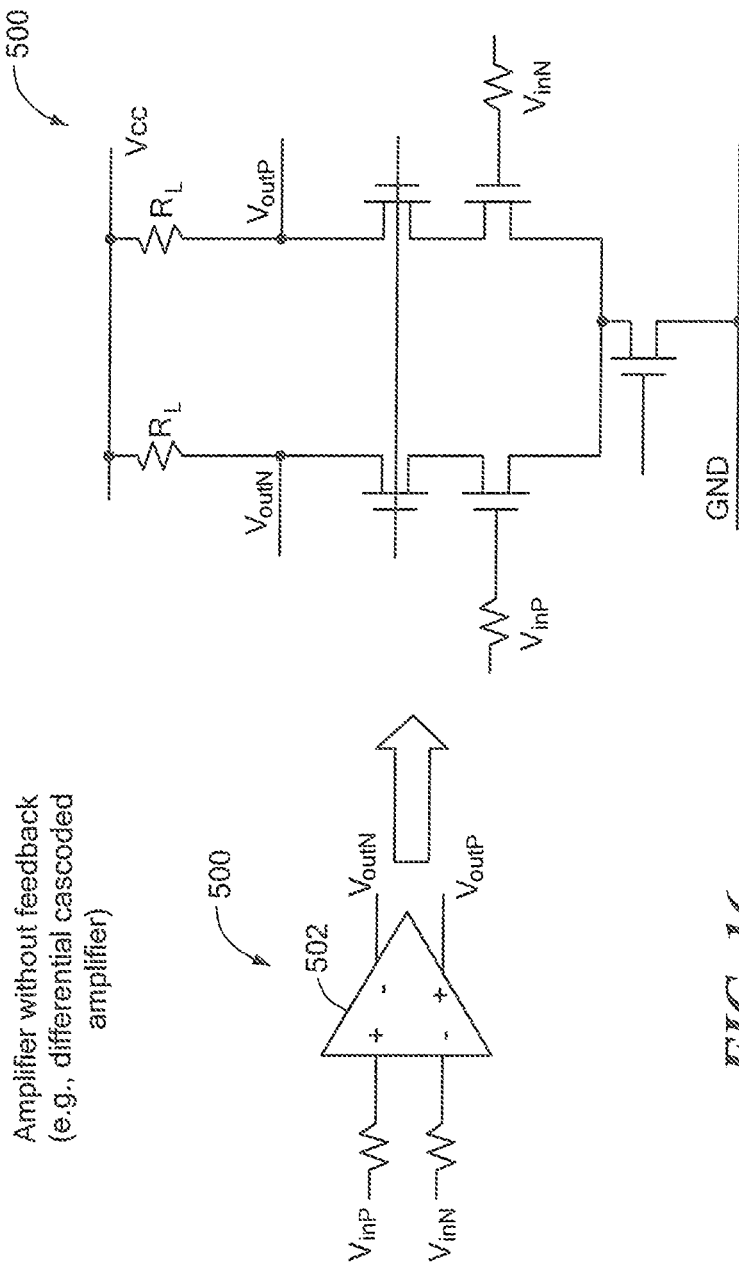
FIGS. 16 and 17 are schematic diagrams of an amplifier circuit without feedback that may be considered for use as a buffer amplifier during a receiver design process in accordance with an embodiment.

FIG. 14 is a schematic diagram of an amplifier circuit 480 that may be used within an RF receiver design in accordance with an implementation. During a receiver design process, amplifier circuit 480 may be considered for use as, for example, an output buffer amplifier in an analog receiver chain that will drive an analog to digital converter (e.g., buffer amplifier 460 of FIG. 11, etc.). As shown, amplifier circuit 480 includes an operational amplifier 482 having feedback provided by a pair of feedback resistors 484, 846. The feedback may be implemented to, among other things, improve the linearity of amplifier circuit 480. FIG. 15 is a more detailed schematic diagram of amplifier circuit 480 showing internal circuitry of operational amplifier 482. FIG. 16 is a schematic diagram of an amplifier circuit 500 that may be considered as an alternative to amplifier circuit 480 of FIG. 14 during the same receiver design process. As shown, amplifier circuit 500 includes a differential amplifier 502 that does not use feedback. FIG. 17 is a more detailed schematic diagram of amplifier circuit 500 showing the internal circuitry of differential amplifier 502 as a cascode amplifier.

Figure 18:
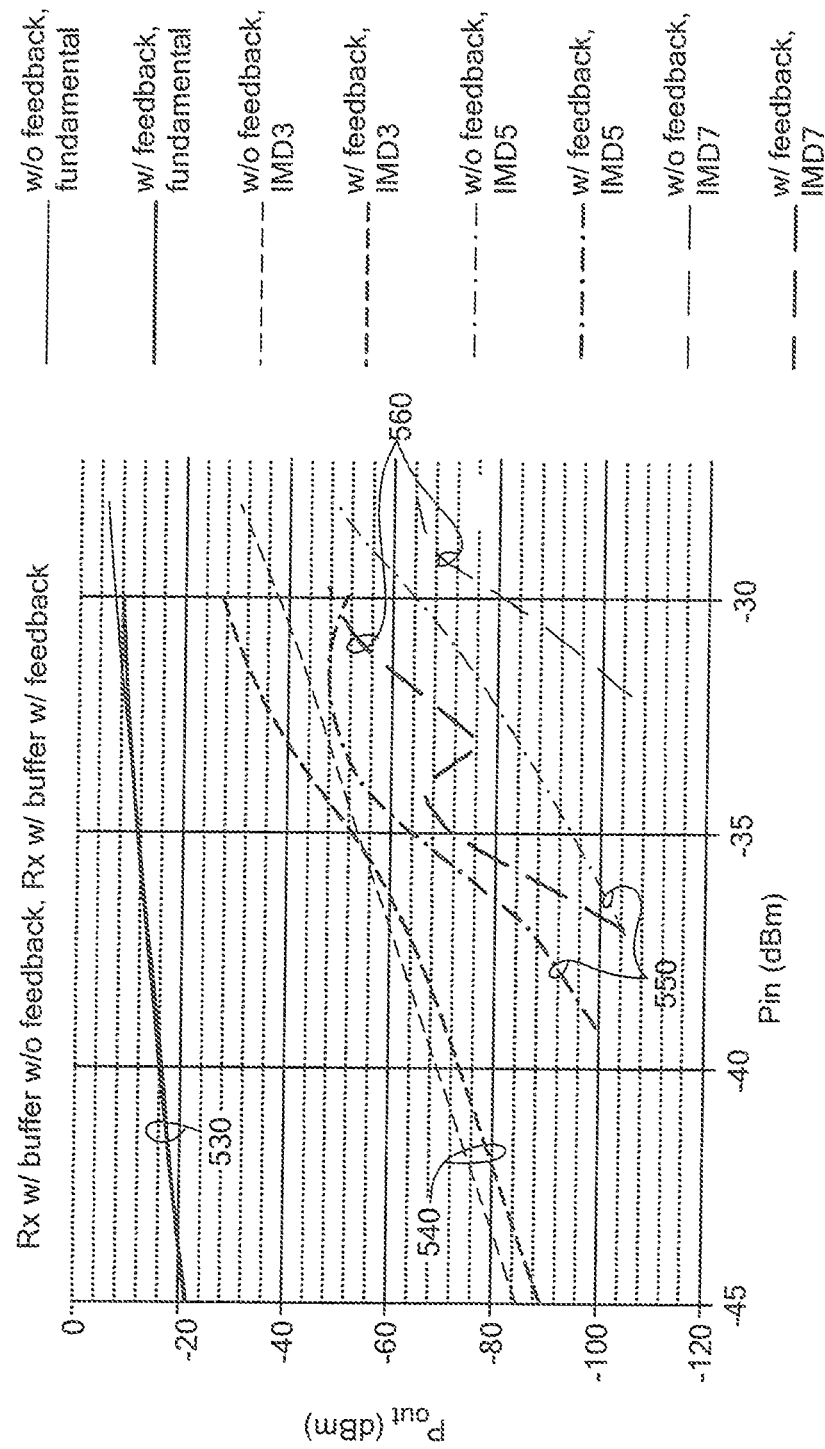
FIG. 18 is a plot illustrating responses for a first receiver having a buffer that uses feedback and a second receiver having a buffer that does not use feedback.

FIG. 18 is a plot illustrating output power versus input power for a first receiver having a buffer that uses feedback (e.g., amplifier circuit 480 of FIG. 14) and a second receiver having a buffer that doesn't use feedback (e.g., amplifier circuit 500 of FIG. 16). Other than the buffer amplifier used, the first and second receivers are substantially the same. The plot of FIG. 18 includes first curves 530 corresponding to the fundamental frequency of the two receivers, second curves 540 corresponding to the third-order inter-modulation product (IMD3), third curves 550 corresponding to the fifth-order inter-modulation product (IMD5), and fourth curves 560 corresponding to the seventh-order inter-modulation product (IMD7). For the most part, in each case, the inter-modulation product component for the receiver that uses feedback is lower than the receiver that does not use feedback. However, as illustrated, the inter-modulation products of the receiver that uses a buffer with feedback differ from their respective 3×, 5×, and 7× slopes of the fundamental by a much wider margin than the corresponding slopes for the other receiver.

This makes the identification of nonlinear distortion terms more complicated and results in a more complex digital equalizer to achieve a desired level of linearity performance.

Figure 19:
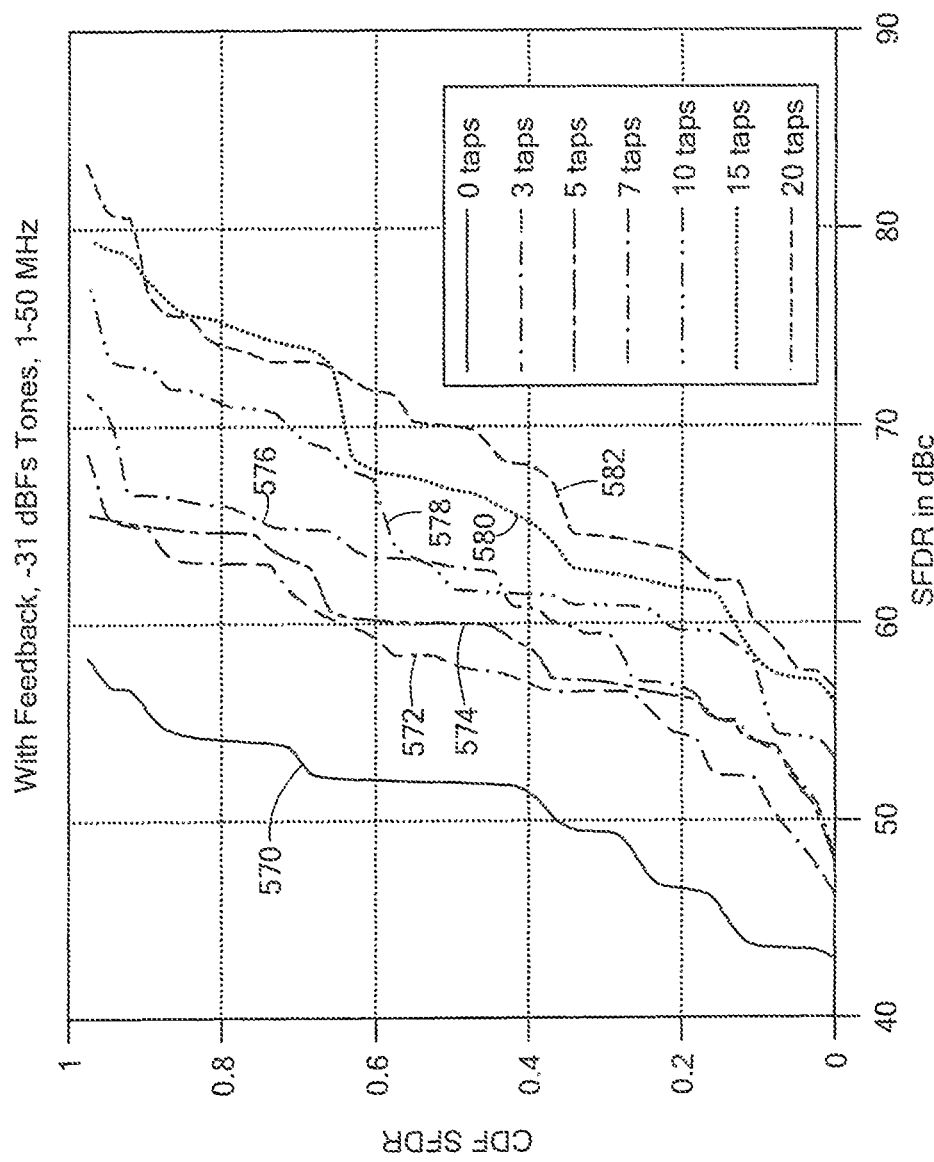
FIG. 19 is a plot illustrating measured spurious free dynamic range (SFDR) for a receiver having a buffer that uses feedback, for various levels of digital compensation.
Figure 20:
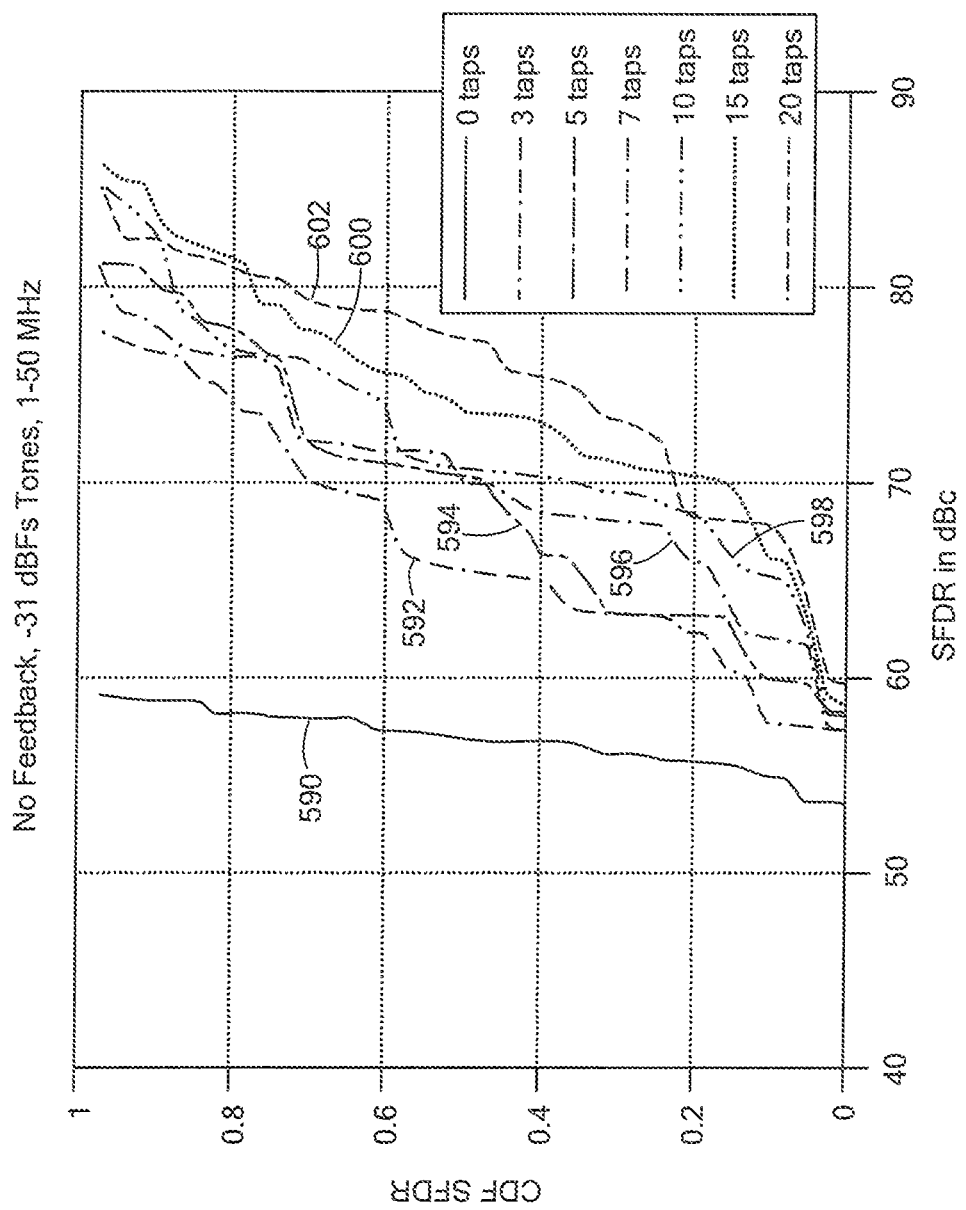
FIG. 20 is a plot illustrating measured SFDR for a receiver having a buffer that does not use feedback, for various levels of digital compensation.

FIG. 19 is a plot showing measured spurious free dynamic range (SFDR) for a receiver that uses feedback within the buffer and FIG. 20 is a plot showing measured SFDR for a receiver that does not use feedback within the buffer, for various levels of digital compensation. FIG. 19 includes a curve 570 for no digital compensation, a curve 572 for a 3-tap digital equalizer, a curve 574 for a 5-tap digital equalizer, a curve 576 for a 7-tap digital equalizer, a curve 578 for a 10-tap digital equalizer, a curve 580 for a 15-tap digital equalizer, and a curve 582 for a 20-tap digital equalizer. Likewise, FIG. 20 includes a curve 590 for no digital compensation, a curve 592 for a 3-tap digital equalizer, a curve 594 for a 5-tap digital equalizer, a curve 596 for a 7-tap digital equalizer, a curve 598 for a 10-tap digital equalizer, a curve 600 for a 15-tap digital equalizer, and a curve 602 for a 20-tap digital equalizer. As shown in the figures, in this particular instance, the receiver that uses a buffer without feedback (FIG. 20) achieves better linearity performance, even when no digital compensation is used. This is not an expected result. That is, a receiver that uses a buffer with feedback normally achieves better linearity performance. But as the drive level exceeds the level that the feedback loop can correct for, the feedback is not as effective, showing worse linearity performance than the receiver that uses a buffer without feedback. In addition, a more predictable nonlinear behavior of the receiver that uses a buffer without feedback makes the digital compensation more effective and simpler. Typically, a designer would not be aware of the above described information before a receiver design task is undertaken, potentially resulting in a receiver that consumes much more power than needed. The receiver design methods described herein provide an enhanced technique for achieving lower power receiver designs in an efficient and systematic manner.

Figure 21:
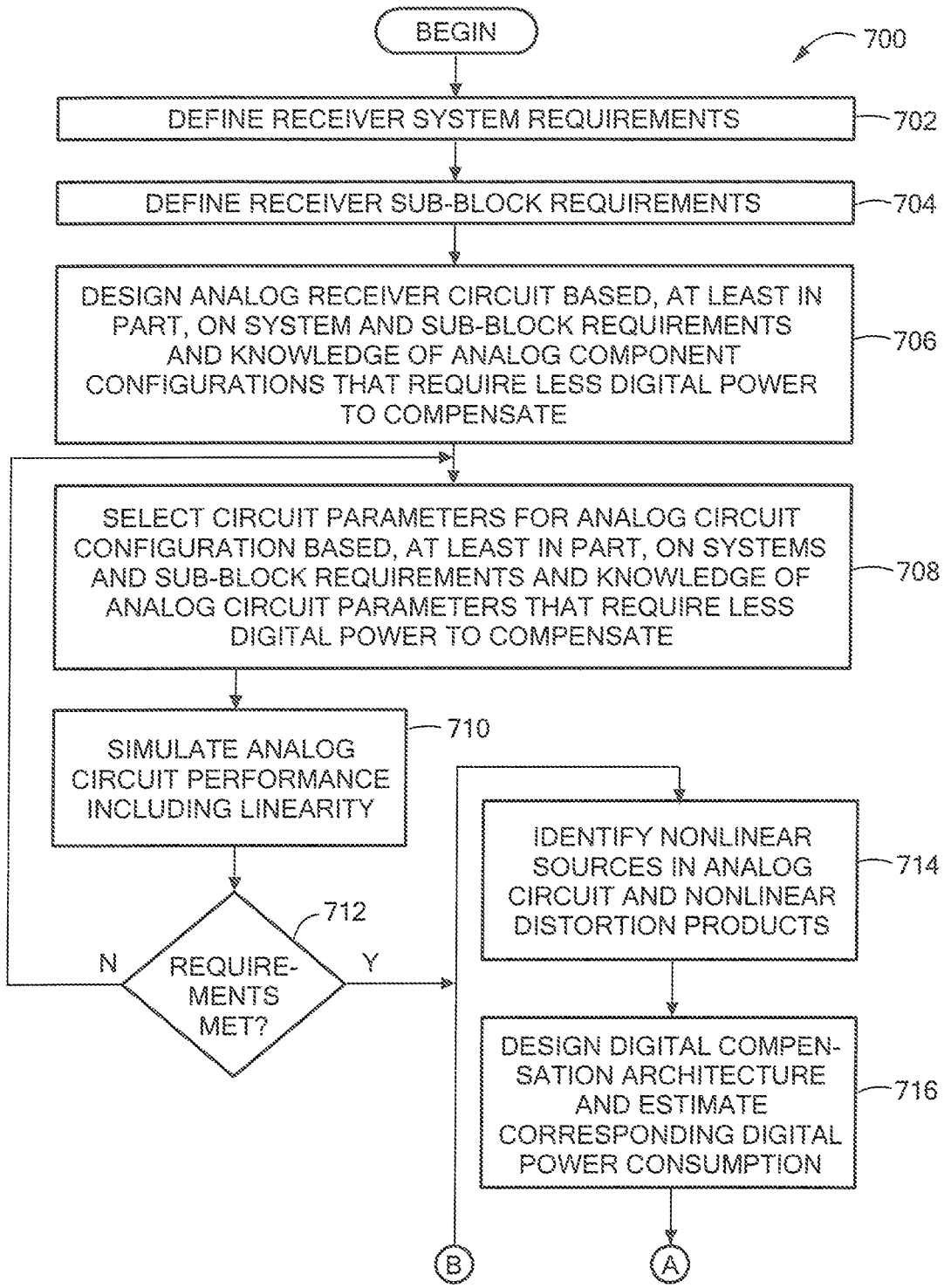
FIGS. 21 and 22 are portions of a flowchart illustrating a method for use in designing an RF receiver system in accordance with another embodiment.
Figure 22:
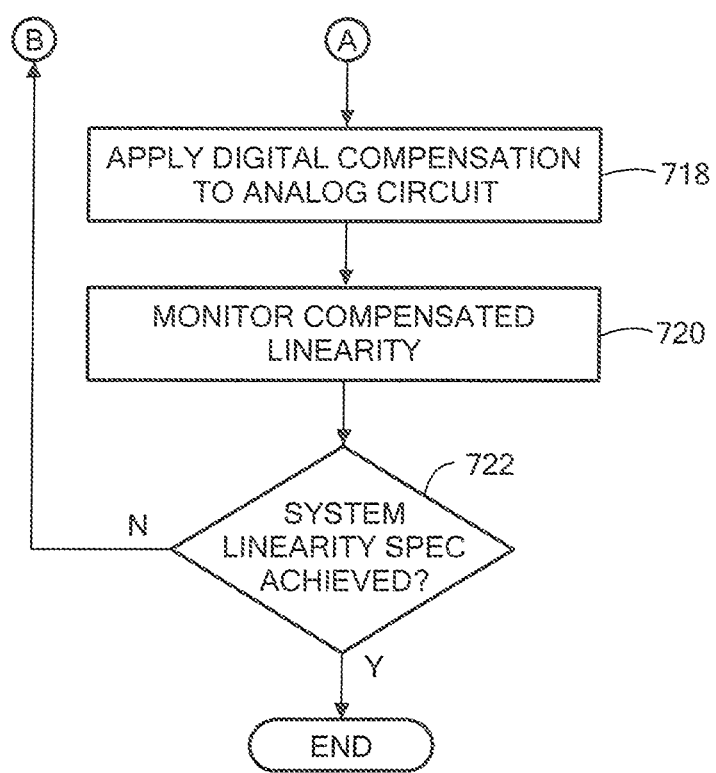

After using the design techniques described above for a while, a designer may begin to gain knowledge of different analog receiver architectures, and/or individual receiver component architectures or designs, that require less digital compensation to achieve a desired receiver linearity. In such cases, a simpler design process may be used to achieve a low power receiver. FIGS. 21 and 22 are portions of a flowchart illustrating such a method 700 in accordance with an embodiment. As before, system requirements and/or sub-block requirements may first be defined for the receiver system (blocks 702, 704). An RF receiver system architecture may then be selected based, at least in part, on the system and/or sub-block requirements and knowledge of analog component configurations that require less power to digitally compensate (block 706). Circuit parameters may also be selected for the analog receiver system based, at least in part, on the system and/or sub-block requirements and knowledge of analog circuit parameters that require less power to digitally compensate (block 708).

As before, after the RF receiver architecture and the analog circuit parameters have been selected, the performance of the RF receiver circuit may be simulated to determine whether system and/or sub-block requirements have been achieved (block 710). If certain requirements have not been achieved, changes may be made to the circuit parameters until desired analog performance is achieved (block 712). Because digital nonlinearity compensation is to be used, however, the system linearity requirement does not need to be met at this point.

After an analog design is determined, sources of nonlinearity and nonlinear distortion components may be identified (block 714). A digital compensation architecture may then be designed and the power consumption of the digital compensation circuitry may be estimated (block 716). Referring now to FIG. 22, the digital compensation architecture may next be applied to the analog receiver system (block 718) and the linearity performance of the modified system may be simulated (block 720). If the modified system does not achieve the specified system linearity requirement (block 722-N), then the method 700 may repeat the digital design process to make modifications to the digital compensation architecture. This process may then be repeated until the system linearity requirement has been achieved or some other condition has been met (e.g., a maximum number of design iterations has occurred, etc.). Because analog components have been used that are known to require a reduced level of digital nonlinearity compensation, additional design iterations to try other analog design configurations may not be required. However, in some implementations, one or more alternative analog configurations may be tried even if knowledge of optimal analog circuitry is used during the initial analog design phase.

The methods described herein may be used to design receivers for use in any of a wide range of different applications including, for example, wireless and/or wireline communications, optical communications, satellite communications, cable television applications, computer networking applications, cellular communications systems, and/or any other application where linear operation with lower power consumption may be desired.

Having described exemplary embodiments of the invention, it will now become apparent to one of ordinary skill in the art that other embodiments incorporating their concepts may also be used. The embodiments contained herein should not be limited to disclosed embodiments but rather should be limited only by the spirit and scope of the appended claims. All publications and references cited herein are expressly incorporated herein by reference in their entirety.

What is claimed is:

1. A method for designing a receiver system, comprising:
generating an initial RF receiver design;
characterizing nonlinearities in the initial RF receiver design;
designing digital nonlinearity compensation circuitry for the initial RF receiver design based on the nonlinearities and applying the digital nonlinearity compensation circuitry to the initial RF receiver design; and
iteratively modifying the RF receiver design and the digital nonlinearity compensation circuitry to identify a combination of the two that achieves a receiver linearity requirement with relatively low power consumption.

2. The method of claim 1, wherein:
iteratively modifying includes iteratively modifying the analog receiver design and the digital nonlinearity compensation circuitry to identify a combination of the two that achieves the receiver linearity requirement with relatively low power consumption in the digital nonlinearity compensation circuitry.

3. The method of claim 2, further comprising:
estimating power consumption of the digital nonlinearity compensation circuitry each time the digital nonlinearity compensation circuitry is modified.

4. The method of claim 3, wherein:
the digital nonlinearity compensation circuitry includes an analog to digital converter (ADC) and a digital equalizer having a plurality of taps.

5. The method of claim 4, wherein:
iteratively modifying the RF receiver design and the digital nonlinearity compensation circuitry to identify a combination of the two that achieves the system linearity requirement with relatively low power consumption in the digital nonlinearity compensation circuitry includes identifying an analog receiver design that requires a lowest number of computations in the digital equalizer to achieve the receiver linearity requirement.

6. A method for designing a receiver comprising an RF receiver chain followed by a digital equalization circuit, the method comprising:
selecting components for the RF receiver chain that allow the RF receiver chain to achieve receiver design requirements other than a receiver linearity requirement; and
designing the digital equalization circuit to reduce nonlinear distortion components in an output signal of the RF receiver chain in a manner that achieves the receiver linearity requirement;
wherein selecting components for the RF receiver chain includes selecting components having nonlinear characteristics that require a relatively small number of computations within the digital equalization circuit to achieve the receiver linearity requirement.

7. The method of claim 6, wherein:
selecting components for the RF receiver chain includes selecting components having nonlinear characteristics that require relatively low power consumption in the digital equalization circuit to achieve the receiver linearity requirement.

8. The method of claim 6, wherein:
selecting components for the RF receiver chain includes selecting components having nonlinear characteristics that require a minimum level of power consumption in the digital equalization circuit to achieve the receiver linearity requirement.

9. A method for designing a receiver comprising an RF receiver chain followed by a digital compensation circuit, the method comprising:
identifying multiple candidate RF receiver chain designs that are capable of achieving receiver design requirements other than a receiver linearity requirement;
designing digital compensation circuits for each of the candidate RF receiver chain designs to achieve the receiver linearity requirement; and
selecting an RF receiver chain/digital compensation circuit combination having a lowest power consumption.

10. The method of claim 9, wherein:
selecting an RF receiver chain/digital compensation circuit combination having a lowest power consumption includes selecting a combination having a lowest power consumption for the full receiver.

11. The method of claim 9, wherein:
selecting an RF receiver chain/digital compensation circuit combination having a lowest power consumption includes selecting a combination having a lowest power consumption in the digital compensation circuit.

12. The method of claim 11, wherein:
designing digital compensation circuits includes designing a digital equalizer for each of the candidate analog receiver chain designs; and
selecting an RF receiver chain/digital compensation circuit combination having a lowest power consumption includes selecting a combination that includes a lowest number of active taps within a corresponding digital equalizer.

13. The method of claim 11, further comprising:
estimating a digital power consumption of each digital compensation circuit designed, wherein selecting an RF receiver chain/digital compensation circuit combination having a lowest power consumption includes selecting a combination having a lowest estimated digital power consumption.

14. A method for designing a receiver system, comprising:
generating an RF receiver design based on specified system requirements;
defining operational constraints for components of the RF receiver design to limit nonlinearity in the RF receiver design while achieving component performance requirements;
characterizing non-linearities in the RF receiver design operating under the operational constraints; and
designing supplemental digital compensation circuitry for the RF receiver design operating under the operational constraints to reduce non-linear distortion components in an output signal thereof;
wherein generating an analog receiver design includes selecting components for the analog receiver design that require a low level of supplemental digital compensation to achieve a receiver linearity requirement.

15. The method of claim 14, wherein:
defining operational constraints for components of the analog receiver design includes limiting operation of amplifiers in the analog receiver design to a 1 dB compression point and below.

16. The method of claim 14, wherein:
characterizing non-linearities in the analog receiver design includes performing a calibration procedure that includes delivering a series of multi-tone signals to an input of the analog receiver design and analyzing resulting output signals.

17. The method of claim 14, wherein:
generating an RF receiver design includes selecting components for the RF receiver design that require minimal power consumption in the supplemental digital compensation circuitry to achieve the receiver linearity requirement.

18. A method for designing a receiver system, comprising:
designing an RF receiver circuit based, at least in part, on specified receiver requirements;
selecting circuit parameters for the RF receiver circuit based, at least in part, on the specified receiver requirements;
identifying nonlinear distortion components in an output signal of the RF receiver circuit and sources of the nonlinear distortion components within the RF receiver circuit;
designing a digital compensation circuit for the RF receiver circuit to reduce nonlinear distortion components within the output signal of the RF receiver circuit and estimating power consumption of the digital compensation circuit;
measuring linearity of the digitally compensated RF receiver circuit and, if a receiver linearity requirement has not been achieved, repeating identifying nonlinear distortion components, designing a digital compensation circuit, and measuring linearity until the receiver linearity requirement is achieved; and
when the system linearity requirement has been achieved, determining whether a power condition has been satisfied and, if not, repeating designing an RF receiver circuit, selecting circuit parameters, identifying nonlinear distortion components, designing a digital compensation circuit, measuring linearity, and determining until the power condition has been satisfied.

19. The method of claim 18, wherein:

the power condition includes achieving a predetermined power dissipation in the digital compensation circuit.

20. The method of claim 18, wherein:

the power condition includes achieving a minimal power dissipation in the digital compensation circuit.

21. The method of claim 18, wherein:

the power condition includes performing a predetermined number of iterations of designing an analog receiver circuit, selecting circuit parameters, identifying nonlinear distortion components, designing a digital compensation circuit, measuring linearity, and determining.

22. The method of claim 18, wherein:

identifying nonlinear distortion components includes performing a calibration procedure that includes delivering a series of multi-tone signals to an input of the RF receiver circuit and analyzing resulting output signals.

23. A receiver comprising:

an RF receiver chain having a plurality of analog circuit components, each of the analog circuit components having known nonlinear response characteristics; and a digital equalizer coupled to an output of the RF receiver chain, the digital equalizer to reduce one or more nonlinear distortion components in an output signal of the RF receiver chain to achieve a receiver linearity requirement, wherein the circuit components of the analog receiver chain are selected to achieve low power consumption in the digital equalizer.

24. The receiver architecture of claim 23, wherein:

the analog receiver chain includes a number of amplifiers, all of which are driven at or below their 1 dB compression points under normal operating conditions.

25. The receiver architecture of claim 23, wherein:

the circuit components of the RF receiver chain are selected to achieve minimum power consumption in the digital equalizer.

* * * * *